(12) United States Patent
Komori et al.

(10) Patent No.: US 9,897,915 B2
(45) Date of Patent: Feb. 20, 2018

(54) PHOTOSENSITIVE RESIN COMPOSITION, METHOD FOR PRODUCING HEAT-RESISTANT RESIN FILM AND DISPLAY DEVICE

(71) Applicant: TORAY INDUSTRIES, INC., Tokyo (JP)

(72) Inventors: Yusuke Komori, Otsu (JP); Mika Koshino, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 14/647,747

(22) PCT Filed: Dec. 13, 2013

(86) PCT No.: PCT/JP2013/083491
§ 371 (c)(1),
(2) Date: May 27, 2015

(87) PCT Pub. No.: WO2014/097992
PCT Pub. Date: Jun. 26, 2014

(65) Prior Publication Data
US 2015/0301453 A1 Oct. 22, 2015

(30) Foreign Application Priority Data

Dec. 20, 2012 (JP) ................. 2012-277743

(51) Int. Cl.
| | | |
|---|---|---|
| C09D 7/12 | (2006.01) |
| G03F 7/038 | (2006.01) |
| C09D 179/08 | (2006.01) |
| G03F 7/037 | (2006.01) |
| C08G 73/10 | (2006.01) |
| G03F 7/004 | (2006.01) |
| G03F 7/023 | (2006.01) |
| G03F 7/40 | (2006.01) |
| H01L 27/32 | (2006.01) |
| H01L 51/52 | (2006.01) |

(52) U.S. Cl.
CPC ....... *G03F 7/0387* (2013.01); *C08G 73/1039* (2013.01); *C09D 7/12* (2013.01); *C09D 179/08* (2013.01); *G03F 7/0046* (2013.01); *G03F 7/0233* (2013.01); *G03F 7/037* (2013.01); *G03F 7/40* (2013.01); *H01L 27/3258* (2013.01); *H01L 51/529* (2013.01)

(58) Field of Classification Search
CPC .... G03F 7/0387; G03F 7/0233; G03F 7/0046; G03F 7/037; C08G 73/1039; C09D 7/12; C09D 7/9108
See application file for complete search history.

(56) References Cited

FOREIGN PATENT DOCUMENTS

| | | | |
|---|---|---|---|
| EP | 1475605 A1 | 11/2004 | |
| JP | 2007-156243 A | 6/2007 | |
| JP | 2007-183388 A | 7/2007 | |
| JP | 2008-33283 A | 2/2008 | |
| KR | 101227280 B1 * | 1/2013 | ........... G03F 7/0048 |
| WO | WO 2008/123053 A1 | 10/2008 | |
| WO | WO 2011/030744 A1 | 3/2011 | |

OTHER PUBLICATIONS

Extended European Search Report; dated Feb. 3, 2017, for European Application No. 13864249.1.
International Search Report, Issued in PCT/JP2013/083491, dated Mar. 11, 2014.

\* cited by examiner

*Primary Examiner* — Sanza Mcclendon
(74) *Attorney, Agent, or Firm* — Birch, Stewart, Kolasch & Birch, LLP

(57) ABSTRACT

The present invention provides a photosensitive resin composition which uses a polyimide precursor that has excellent solubility in organic solvents and is capable of reducing the viscosity of a resin composition obtained therefrom. The solution according to the present invention is a photosensitive resin composition which contains: an aromatic amide resin that has, as a main repeating unit, a specific structure having an amide group, a trifluoromethyl group and an aromatic ring; (b) a sensitizer; and (c) a solvent.

12 Claims, No Drawings

PHOTOSENSITIVE RESIN COMPOSITION, METHOD FOR PRODUCING HEAT-RESISTANT RESIN FILM AND DISPLAY DEVICE

TECHNICAL FIELD

The present invention relates to a photosensitive resin composition containing a resin having a specific structure as a main component. More specifically, the present invention relates to a photosensitive resin composition suitable for surface protection films and interlayer insulation films for semiconductor devices, insulation films for organic electroluminescence (hereinafter abbreviated as EL) devices, planarizing films for the substrate of thin film transistors (hereinafter abbreviated as TFT) to drive displaying devices including organic EL devices, wiring-protecting insulation films for circuit boards, on-chip microlens for solid imaging devices, and planarizing film for various display and solid imaging devices.

BACKGROUND ART

Polyimides are widely used for surface protection films, interlayer insulation films and planarizing films in semiconductor devices, and so on. Recently, polyimides have been used for, for example, insulation films in organic EL devices, planarizing films in TFT substrates, and so on. In these applications, the substrates used have a very large size as compared to those used in semiconductor devices, and therefore, slit coating is generally employed to apply a resin composition. The slit coating technique uses a slit nozzle for coating, which unlike the conventional spin coating technique, does not require the rotation of the substrate to ensure a decreased consumption of resin compositions and improved safety of the process, resulting in a wide use. In performing the slit coating technique, the coating film discharged from the slit nozzle contains a solvent in large amounts, and therefore, it is commonly followed by vacuum drying to remove the solvent quickly after the coating step and subsequent heat drying using a hot plate or the like.

In the slit coating technique, the film thickness depends on a discharge rate from the slit nozzle and a solid content in a resin composition to be coating liquid. Therefore, it is necessary to increase the discharge rate or increase the solid content in the resin composition for forming a thick film. However, when the discharge rate is excessively large, the liquid level swings during transportation of a substrate, so that film thickness uniformity is deteriorated. On the other hand, a resin composition including a polyimide or a polyimide precursor has the problem that when the solid content in the resin composition is increased, the viscosity becomes excessively high.

The viscosity of the resin composition can be reduced by using a good solvent for the resin or a solvent having a low viscosity in itself. The polyimide and polyimide precursor have a rigid structure, and therefore often have low solubility in various solvents. There have been proposed polyimides having improved solubility in organic solvents (see, for example, Patent Document 1) and polyimide precursors having improved solubility in organic solvents (see, for example, Patent Documents 2 and 3). However, even these resins have insufficient solubility in organic solvents. Further, resin compositions having a viscosity suitable for slit coating cannot be obtained from these resins.

PRIOR ART DOCUMENTS

Patent Documents

Patent Document 1: Japanese Patent Laid-open Publication No. 2005-41936
Patent Document 2: Japanese Patent Laid-open Publication No. 2011-42701
Patent Document 3: Japanese Patent Laid-open Publication No. 2011-202059

SUMMARY OF THE INVENTION

Problems to be Solved by the Invention

In view of the above-described problems, an object of the present invention is to provide a photosensitive resin composition which contains a polyimide precursor having high solubility in an organic solvent, has a low viscosity and hence excellent coatability, thus ensures formation of a film with a uniform thickness, and has high pattern processability.

Solutions to the Problems

That is, the present invention provides a photosensitive resin composition including: an aromatic amide resin (a1) which has an amide group, a trifluoromethyl group and an aromatic ring and which is soluble in propylene glycol monomethyl ether acetate; a photosensitive agent (b); and a solvent (c), wherein the photosensitive resin composition has a solid content of 20% by weight and a viscosity of 1 to 15 cp at 25° C.; or a photosensitive resin composition including: an aromatic amide resin (a2) which has an amide group, an amide acid ester, a trifluoromethyl group and an aromatic ring and which is soluble in propylene glycol monomethyl ether acetate; a photosensitive agent (b); and a solvent (c), wherein the photosensitive resin composition has a solid content of 20% by weight and a viscosity of 1 to 15 cp at 25° C.; or a photosensitive resin composition including: a resin (a) having as a main repeating unit a structure represented by the general formula (1); a photosensitive agent (b); and a solvent (c).

[Chemical compound 1]

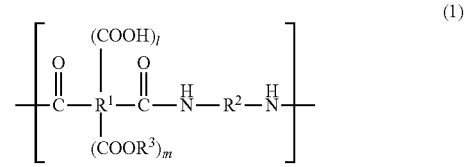

(in the general formula (1), different groups may exist as each of $R^1$ to $R^3$ in a plurality of repeating units; $R^1$ is a tetravalent organic group, where 95 to 100 mol % of $R^1$ in all the repeating units is a group represented by the following formula (2); $R^2$ is a divalent organic group, where 50 to 99 mol % of $R^2$ in all the repeating units is a group represented by the following formula (3), and 1 to 50 mol % of $R^2$ in all the repeating units is a group represented by the following formula (4); $R^3$ represents an organic group with a carbon number of 1 to 20; and l and m each represent an integer of 0 to 2, where l+m=2).

[Chemical compound 2]

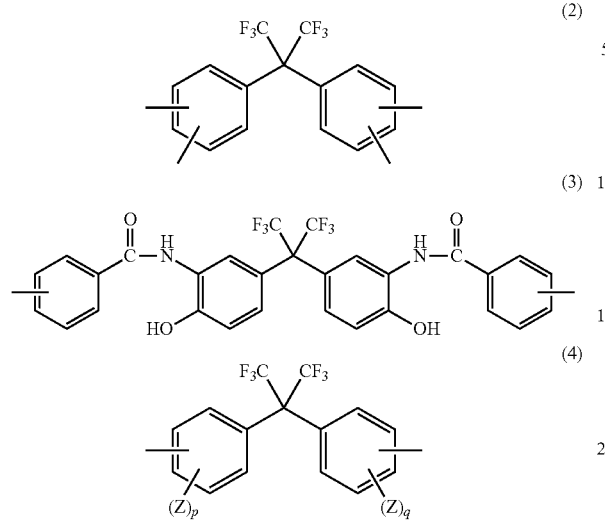

(in the general formula (4), Z represents a hydroxyl group or a methyl group, and p and q each represent 0 or 1).

The present invention also provides a method for producing a heat-resistant resin film, the method including the steps of: applying a photosensitive resin composition of the present invention to a substrate to form a photosensitive resin film; drying the photosensitive resin film; exposing the dried photosensitive resin film; developing the exposed photosensitive resin film; and subjecting the developed photosensitive resin film to a heating treatment, wherein using a coating apparatus fed with a photosensitive resin composition other than the photosensitive resin composition of the present invention, the photosensitive resin composition according to any one of claims 1 to 7 is applied to a substrate without cleaning the inside of a liquid feeding passage of the coating apparatus.

Effects of the Invention

According to the present invention, there can be provided a photosensitive resin composition which contains a polyimide precursor having high solubility in an organic solvent, has a low viscosity and hence excellent coatability, thus ensures formation of a film with a uniform thickness, and has high pattern processability.

EMBODIMENTS OF THE INVENTION

The photosensitive resin composition of the present invention is a photosensitive resin composition including: an aromatic amide resin (a1) which has an amide group, a trifluoromethyl group and an aromatic ring and which is soluble in propylene glycol monomethyl ether acetate; a photosensitive agent (b); and a solvent (c), wherein the photosensitive resin composition has a solid content of 20% by weight and a viscosity of 1 to 15 cp at 25° C.; or a photosensitive resin composition including: an aromatic amide resin (a2) which has an amide group, an amide acid ester, a trifluoromethyl group and an aromatic ring and which is soluble in propylene glycol monomethyl ether acetate; a photosensitive agent (b); and a solvent (c), wherein the photosensitive resin composition has a solid content of 20% by weight and a viscosity of 1 to 15 cp at 25° C.; or a photosensitive resin composition including: a resin (a) having as a main repeating unit a structure represented by the general formula (1); a photosensitive agent (b); and a solvent (c). The components will be described in detail below, but the present invention is not limited thereto.

Resin (a1), Resin (a2) and Resin (a3)

One aspect of the photosensitive resin composition of the present invention is a photosensitive resin composition containing an aromatic amide resin (a1) which has an amide group, a trifluoromethyl group and an aromatic ring and which is soluble in propylene glycol monomethyl ether acetate.

Another aspect of the photosensitive resin composition of the present invention is a photosensitive resin composition containing an aromatic amide resin (a2) which has an amide group, an amide acid ester, a trifluoromethyl group and an aromatic ring and which is soluble in propylene glycol monomethyl ether acetate.

The amide group is an amide (CONH), an amide (—CONHCOOH) acid or a hydroxyamide (CONHOH). A plurality of different amide groups may be contained. The amide acid ester group is CONHCOOR (R is an organic group).

Examples of the aromatic amide resin include resins having structures of polyhydroxyamide that can form a polybenzoxazole precursor, polyamino-amide, polyamide-imide, a polyamide acid as a polyimide precursor, and a polyamide acid ester, and resins having structures of polyhydroxyamide and a polyamide acid ester are preferably used. More preferably, resins having a structural unit represented by the general formula (1) are used.

Still another aspect of the photosensitive resin composition of the present invention is a photosensitive resin composition containing a resin having as a main repeating unit a structure represented by the general formula (1). Different groups may exist as each of $R^1$ to $R^3$ in a plurality of repeating units, and since at least two kinds of $R^2$ are contained, the resin (a) is a copolymer having two or more different repeating units. Two or more resins having as a main repeating unit a structure represented by the general formula (1) may be contained.

Hereinafter, the description of the resin (a) may mean the resin (a1), the resin (a2) and the resin (a).

The resin having as a main repeating unit a structure represented by the general formula (1) is a polyimide precursor which, when heated, undergoes ring closure to form a polyimide having excellent heat resistance and solvent resistance. The polyimide precursor can be obtained by reacting a tetracarboxylic acid and a derivative thereof (hereinafter referred to as an acid component) as monomer components with a diamine compound (hereinafter, referred to as a diamine component).

[Chemical compound 3]

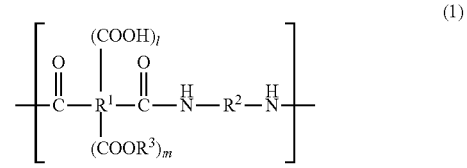

In the general formula (1), different groups may exist as each of $R^1$ to $R^3$ in a plurality of repeating units. $R^1$ is a tetravalent organic group, where 95 to 100 mol % of $R^1$ in all the repeating units is a group represented by the following formula (2). $R^2$ is a divalent organic group, where 50 to 99 mol % of $R^2$ in all the repeating units is a group represented by the following formula (3), and 1 to 50 mol % of $R^2$ in all the repeating units is a group represented by the following formula (4). $R^3$ represents an organic group with a carbon number of 1 to 20; and l and m each represents an integer of 0 to 2, where l+m=2.

[Chemical compound 4]

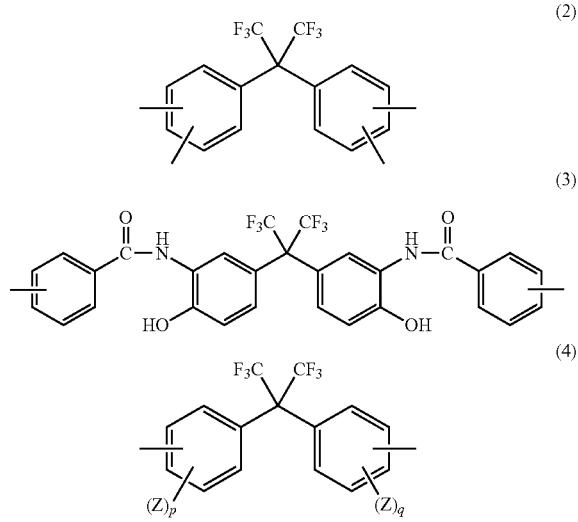

(in the general formula (4), Z represents a hydroxyl group or a methyl group, and p and q each represent 0 or 1).

$R^1$ in the general formula (1) represents a group derived from the acid component, and examples of the acid component in which $R^1$ is a group represented by the formula (2) include 2,2-bis(3,4-dicarboxyphenyl)hexafluoropropane and 2,2-bis(2,3-dicarboxyphenyl)hexafluoropropane.

When $R^1$ has 95 mol % or more of a group represented by the formula (2), solubility in an organic solvent is improved, and the viscosity of the resin composition can be reduced.

$R^1$ in the general formula (1) should be a tetravalent group with a carbon number of 2 or more, which has 95 to 100 mol % of a group represented by the formula (2), and when $R^1$ does not have as a remaining group a group represented by the formula (2), it may have a group other than that of the formula (2) in the first place. In this case, the group other than that of the formula (2) is not particularly limited.

Preferable examples of the acid component in this case may include aromatic tetracarboxylic acids such as pyromellitic acid, 3,3',4,4'-biphenyl tetracarboxylic acid, tetracarboxylic acid, 2,2',3,3'-biphenyl tetracarboxylic acid, 3,3',4,4'-benzophenone tetracarboxylic acid, 2,2',3,3'-benzophenone tetracarboxylic acid, 1,1-bis(3,4-dicarboxyphenyl) ethane, 1,1-bis(2,3-dicarboxyphenyl) ethane, bis(3,4-dicarboxyphenyl) methane, bis(2,3-dicarboxyphenyl) methane, bis(3,4-dicarboxyphenyl) sulfone, bis(3,4-dicarboxyphenyl) ether, 1,2,5,6-naphthalene tetracarboxylic acid, 2,3,6,7-naphthalene tetracarboxylic acid, 2,3,5,6-pyridine tetracarboxylic acid and 3,4,9,10-perylene tetracarboxylic acid, and aliphatic tetracarboxylic acids such as butane tetracarboxylic acid and 1,2,3,4-cyclopentane tetracarboxylic acid.

When $R^1$ does not have a group represented by the formula (2), the acid component may be a dicarboxylic acid or a tricarboxylic acid.

Examples of dicarboxylic acid include terephthalic acid, isophthalic acid, diphenyl ether dicarboxylic acid, bis(carboxyphenyl) hexafluoropropane, biphenyl dicarboxylic acid, benzophenone dicarboxylic acid and triphenyl dicarboxylic acid, and examples of tricarboxylic acid include trimellitic acid, trimesic acid, diphenyl ether tricarboxylic acid, and biphenyl tricarboxylic acid.

Preferable examples of the acid component when $R^1$ does not have a group represented by the formula (2) include tetracarboxylic acids containing a silicon atom such as dimethylsilane diphthalic acid and 1,3-bis(phthalic acid) tetramethyl disiloxane, and use thereof can serve to increase the adhesiveness to the substrate and the resistance to oxygen plasma used for cleaning and the like and to UV ozone processing.

These acids may be used in their original form or in the form of an anhydride or an active ester.

$R^2$ in the general formula (1) represents a group derived from the diamine component, and when $R^2$ has 50 mol % or more of a group represented by the formula (3), the solubility of the resulting resin in an aqueous alkali solution is kept in a proper range, so that a photosensitive resin composition having high pattern processability can be obtained. The content of the group represented by the formula (3) is preferably 55 mol % or more, more preferably 60 mol % or more from the viewpoint of the pattern processability of the photosensitive resin composition.

When $R^2$ in the general formula (1) has 1 mol % or more, preferably 5 mol % or more, more preferably 10 mol % or more of a group represented by the general formula (4), solubility in an organic solvent is improved. The content of the group represented by the general formula (4) is further preferably 15 mol % or more, more preferably 20 mol % or more. On the other hand, when the content of the group represented by the general formula (4) is 50 mol % or less, solubility in an aqueous alkali solution is properly kept. The content of the group represented by the general formula (4) is preferably 45 mol % or less, more preferably 40 mol % or less. When the content of the group represented by the general formula (4) is more than 50 mol %, the concentration of phenolic hydroxyl groups in the resin increase, and therefore the solubility of the resulting resin in an aqueous alkali solution becomes excessively high, so that development film loss amount in the resulting photosensitive resin composition increases. An increase in development film loss amount is not preferable because film thickness uniformity in the surface is deteriorated, and the development margin is narrowed. Further, when the content of the group represented by the general formula (4) is more than 50 mol %, the imidization ratio increases is not preferable because the permeability of the film at an exposure wavelength is deteriorated, and the sensitivity decreases. The sum of the ratio at which $R^2$ in the general formula (1) has a group represented by the formula (3) and the ratio at which $R^2$ in the general formula (1) has a group represented by the general formula (4) does not exceed 100 mol %.

Examples of the diamine component in which $R^2$ is a group of the general formula (4) include 2,2-bis(3-amino-4-hydroxyphenyl)hexafluoropropane, 2,2-bis(3-amino-4-methylphenyl)hexafluoropropane and 2,2-bis(4-aminophenyl)hexafluoropropane. Among them, 2,2-bis(3-amino-4-hydroxyphenyl)hexafluoropropane is especially preferable from the viewpoint of the solubility of the resulting resin in an aqueous alkali solution.

$R^2$ in the general formula (1) should be a divalent group with a carbon number of 2 or more, which has 50 to 99 mol %, preferably 50 to 90 mol % of a group represented by the formula (3), and has 1 to 50 mol %, preferably 10 to 50 mol % of a group represented by the general formula (4), and other groups are not particularly limited.

Preferable examples of the diamine component that can be used in combination include diamines containing silicon atoms such as 1,3-bis(3-aminopropyl)tetramethyldisiloxane and 1,3-bis(4-anilino)tetramethyl disiloxane, and use thereof can serve to increase the adhesiveness to the substrate and the resistance to oxygen plasma used for cleaning and the like and to UV ozone processing. Preferably, these diamines containing silicon atoms are used in an amount of 1 to 30 mol % of total diamine components.

These diamine compounds may be used in their original form or in the form of a corresponding diisocyanate compound or a trimethyl silylated diamine.

In the general formula (1), $R^3$ represents an organic group with a carbon number of 1 to 20. l and m each represent an integer of 0 to 2, where l+m=2. m is preferably 1 or greater from the viewpoint of the stability of a photosensitive resin composition including the resulting resin, and moderate solubility in an aqueous alkali solution.

It is preferable that the resin which is used in the photosensitive resin composition of the present invention and which has as a main repeating unit a structure represented by the general formula (1) has at least one end of the molecular chain capped with a monoamine or an acid anhydride. By using an end capping agent, a photosensitive resin composition including the resulting resin is easily adjusted to have a proper viscosity. The end capping agent acts to suppress hydrolysis of the resin by an acid end and to suppress degradation of a quinone diazide compound as a photosensitive agent by an amine end in a positive photosensitive resin composition.

While the monoamine to be used in the end capping agent is not particularly limited, a compound having a group represented by the following general formula (5) is preferable.

[Chemical compound 5]

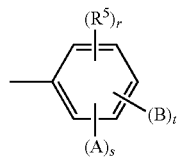

(5)

In the general formula (5), $R^5$ represents a saturated hydrocarbon group with a carbon number of 1 to 6, and r represents 0 or 1. A and B may be the same or different, and each represent a hydroxyl group, a carboxyl group or a sulfonic acid group. s and t each represent 0 or 1, where s+t≥1 from the viewpoint of the solubility of the resulting resin in an aqueous alkali solution.

Preferable examples of the monoamine having a group represented by the general formula (5) may include 2-aminophenol, 3-aminophenol, 2-amino-m-cresol, 2-amino-p-cresol, 3-amino-o-cresol, 4-amino-o-cresol, 4-amino-m-cresol, 5-amino-o-cresol, 6-amino-m-cresol, 4-amino-2,3-xylenol, 4-amino-3,5-xylenol, 6-amino-2,4-xylenol, 2-amino-4-ethylphenol, 3-amino-4-ethylphenol, 2-amino-4-tert-butylphenol, 2-amino-4-phenylphenol, 4-amino-2,6-diphenylphenol, 4-aminosalicylic acid, 5-aminosalicylic acid, 6-aminosalicylic acid, 2-aminobenzoic acid, 3-aminobenzoic acid, 4-aminobenzoic acid, 2-amino-m-toluene acid, 3-amino-o-toluene acid, 3-amino-p-toluene acid, 4-amino-m-toluene acid, 6-amino-o-toluene acid, 6-amino-m-toluene acid, 3-aminobenzene sulfonic acid, 4-aminobenzene sulfonic acid and 4-aminotoluene-3-sulfonic acid. They may be used alone, or used in combination with other end capping agents.

The introduction ratio of the monoamine used as an end capping agent is preferably 10 to 100 mol %, further preferably 40 to 80 mol % based on 100 mol % of the tetracarboxylic acid as a monomer component of the resin. When the introduction ratio of the monoamine is 10 mol % or more, preferably 40 mol % or more, the solubility of the resulting resin in an organic solvent is improved, and the viscosity of a photosensitive resin composition formed using the resulting resin can be properly adjusted. The introduction ratio of the monoamine is preferably 100 mol % or less, further preferably 80 mol % or less, more preferably 70 mol % or less from the viewpoint of the solubility of the resulting resin in an aqueous alkali solution and the mechanical strength of a cured film.

While the acid anhydride to be used in the end capping agent is not particularly limited, an acid anhydride having a cyclic structure or an acid anhydride having a crosslinkable group is preferable from the viewpoint of the heat resistance of the resulting resin. Examples thereof include phthalic anhydride, maleic anhydride, nadic anhydride, cyclohexanedicarboxylic anhydride and 3-hydroxyphthalic anhydride.

The introduction ratio of the acid anhydride used as an end capping agent is preferably 10 to 100 mol %, further preferably 50 to 100 mol % based on 100 mol % of the diamine as a monomer component of the resin. When the introduction ratio of the acid anhydride is 10 mol % or more, preferably 50 mol % or more, the solubility of the resulting resin in an organic solvent is improved, and the viscosity of a photosensitive resin composition formed using the resulting resin can be properly adjusted. The introduction ratio of the acid anhydride is preferably 100 mol % or less, more preferably 90 mol % or less from the viewpoint of the solubility of the resulting resin in an aqueous alkali solution and the mechanical strength of a cured film.

The end capping agent introduced in the resin can be easily detected by the following method. For example, a resin containing an end capping agent is dissolved in an acidic solution to decompose the resin into an amine component and an acid component that are constituent units of the resin, and these components are subjected to gas chromatography (GC) or NMR spectroscopy, whereby the end capping agent can be easily detected. Alternatively, a resin containing an end capping agent is subjected to pyrolysis gas chromatography (PGC), infrared spectroscopy, or $^{13}$C-NMR spectroscopy directly, whereby the end capping agent can be detected.

Where n is a repetition number in the general formula (1) in the resin (a) having as a main repeating unit a structure represented by the general formula (1), n is preferably 5 to 100, especially preferably 10 to 70. When n is smaller than 5, the strength of the cured film of the resulting resin may decrease. On the other hand, when n exceeds 100, the solubility of the resulting resin in an organic solvent may be deteriorated, or the viscosity of the resin composition formed may be excessively high. The repetition number n in the present invention can be easily calculated by measuring a weight average molecular weight (Mw) by gel permeation chromatography (GPC) in terms of polystyrene. Where M is a molecular weight of the repeating unit, and Mw is a weight average molecular weight of the resin, n equals Mw/M. The weight average molecular weight (Mw) of the resin is preferably in a range of 5,000 to 100,000, more preferably in a range of 10,000 to 50,000.

The resin having as a main repeating unit a structure represented by the general formula (1) can be produced in accordance with a known method for producing a polyamide acid or a polyamide acid ester, and the method is not particularly limited. Examples thereof include a method in which a tetracarboxylic dianhydride is reacted with a diamine compound at a low temperature, and a method in which a diester is obtained from a tetracarboxylic dianhydride and an alcohol, and the diester is then reacted with a diamine compound in the presence of a condensing agent. The end capping agent can be substituted for a part of the diamine compound and the acid dianhydride, and examples of the method thereof include a method in which an end capping agent is added in parallel to addition of a diamine compound or a tetracarboxylic dianhydride, a method in which a diamine compound is reacted with a tetracarboxylic dianhydride, and an end capping agent is then added, and a method in which an end capping agent is reacted with a tetracarboxylic dianhydride or a diamine compound, and the diamine compound or the tetracarboxylic dianhydride is then added. When the introduction ratio of the end capping agent exceeds 50 mol %, it is preferable that the end capping agent is reacted with a tetracarboxylic dianhydride or a diamine compound, and the diamine compound or the tetracarboxylic dianhydride is then added, because generation of oligomers such as dimers and trimers is suppressed. Further, it is desirable that a polymer obtained by the above-mentioned method be put in a large amount of water, a mixed liquid of methanol/water or the like, precipitated, separated out by filtration, dried and isolated. By this precipitation operation, unreacted monomers, and oligomer components such as dimers and trimers are removed, so that film properties after heat curing are improved.

A method for producing a polyimide precursor will be described below as a preferable specific example.

First, a tetracarboxylic dianhydride having an $R^1$ group is dissolved in a polymerization solvent, a monoamine is added to this solution, and the mixture is stirred by a mechanical stirrer. After elapse of a predetermined time, a diamine compound having an $R^2$ group is added, and further, the mixture is stirred for a predetermined time. The reaction temperature is 0 to 100° C., preferably 20 to 50° C., and the reaction time is 0.5 to 50 hours, preferably 2 to 24 hours.

The solvent to be used for the polymerization reaction should be capable of dissolving an acid component and a diamine component that are raw material monomers, and while the type of the solvent is not particularly limited, a protic solvent is preferable. Specific examples thereof may include amides such as N,N-dimethyl formamide, N,N-dimethyl acetamide and N-methyl-2-pyrolidone; cyclic esters such as γ-butyrolactone, γ-valerolactone, δ-valerolactone, γ-caprolactone, ε-caprolactone and α-methyl-γ-butyrolactone; carbonates such as ethylene carbonate and propylene carbonate; glycols such as propylene glycol monomethyl ether, diethylene glycol dimethyl ether, diethylene glycol diethyl ether, diethylene glycol ethylmethyl ether and triethylene glycol; phenols such as m-cresol and p-cresol; acetophenone; 1,3-dimethyl-2-imidazolidinone; sulfolane; and dimethyl sulfoxide. The amount of the polymerization solvent used is preferably 100 to 1900 parts by weight, more preferably 150 to 950 parts by weight based on 100 parts by weight of the resulting resin.

The resin (a) having as a main component a structure represented by the general formula (1) in the present invention is preferably a resin that is dissolved in propylene glycol monomethyl ether acetate in a concentration of 30% by weight or more. The resin that is dissolved in propylene glycol monomethyl ether acetate in a concentration of 30% by weight or more has high solubility in an organic solvent, the optionality of solvents is improved when a photosensitive resin composition is formed from the resin.

When 30% by weight of the resin (a) having as a main repeating unit a structure represented by the general formula (1) in the present invention is dissolved in propylene glycol monomethyl ether acetate, the viscosity of the solution at 25° C. is preferably 150 mPa·s or less. By using a resin that forms a solution having a viscosity of 150 mPa·s or less, a low viscosity suitable for slit coating can be maintained even when the solid content of the photosensitive resin composition is increased, and film thickness uniformity can be improved in formation of a thick film by slit coating.

The photosensitive resin composition of the present invention may contain an alkali-soluble resin other than the resin (a) having as a main repeating unit a structure represented by the general formula (1). The alkali-soluble resin refers to a resin having an acidic group soluble in an alkali, and specific examples thereof include radical-polymerizable polymers having acrylic acid, phenol-novolac resins, polyhydroxystyrenes and polysiloxanes. The alkali-solubility may be adjusted by protecting the acidic groups in these resins. These resins are soluble in aqueous alkali solutions of choline, triethyl amine, dimethyl aminopyridine, monoethanol amine, diethyl aminoethanol, sodium hydroxide, potassium hydroxide, sodium carbonate and the like, as well as tetramethyl ammonium hydroxide. Two or more of these resins may contained, but their content is preferably 50 wt % or less of the total quantity of all resins including the component (a).

Photosensitive Agent (b)

The photosensitive resin composition of the present invention contains a photosensitive agent (b). The photosensitive agent may be a combination of a photoacid generating agent (b-1), photopolymerization initiator (b-2) and a compound with two or more ethylenically unsaturated bonds (b-3). The inclusion of the photoacid generating agent (b-1) works to produce an acid in the irradiated portion so that the irradiated portion increases insolubility in an aqueous alkali solution, allowing a positive relief pattern to be formed after dissolution of the irradiated portion. The inclusion of an epoxy compound or a thermal crosslinking agent as described later along with the photoacid generating agent (b-1) allows the acid formed in the irradiated portion to serve for promotion of the crosslinked reaction of the epoxy compound and the thermal crosslinking agent, leading to formation of a negative type relief pattern as a result of insolubilization of the irradiated portion. The inclusion of a photopolymerization initiator (b-2) and a compound with two or more ethylenically unsaturated bonds (b-3) allows the active radicals formed in the irradiated portion to serve for promotion of radical polymerization of ethylenically unsaturated bonds, leading to formation of a negative type relief pattern as a result of insolubilization of the irradiated portion. The photosensitive resin composition according to the present invention preferably contains a photoacid generating agent (b-1) as the photosensitive agent (b) and has positive photosensitivity. Positive photosensitive resin compositions easily form a pattern of a forward tapered shape when calcined after fine patterning in the exposure and development steps. When the resulting resin is used as insulation film in an organic EL device, such a pattern of a forward tapered shape serves to provide a good cover for the upper electrode and prevent disconnection, allowing the device to have an increased reliability.

Examples of the photoacid generating agent (b-1) include quinone diazide compounds, sulfonium salts, phosphonium salts, diazonium salts and iodonium salts.

Examples of the quinone diazide compound include polyhydroxy compounds bonded to sulfonic acid of quinone diazide through ester linkage, polyamino compounds bonded to sulfonic acid of quinone diazide through sulfonamide linkage, and polyhydroxypolyamino compounds bonded to sulfonic acid of quinone diazide through ester linkage and/or sulfonamide linkage. It is preferable that 50 mol % or more of the functional groups in the polyhydroxy compounds and polyamino compounds are substituted by quinone diazide. It is also preferable that two or more photoacid generating agent (b-1) are contained to provide a photosensitive resin composition with high sensitivity.

For the quinone diazide for the present invention, both 5-naphthoquinone diazide sulfonyl group and 4-naphthoquinone diazide sulfonyl group are preferred. A 4-naphthoquinone diazide sulfonyl ester compound absorbs light in the i-line range of mercury lamps, and therefore, it is suitable for i-line exposure. A 5-naphthoquinone diazide sulfonyl ester compound absorbs light in a region including the g-line of mercury lamps, and therefore, it is suitable for g-line exposure. For the present invention, it is preferable to select either a 4-naphthoquinone diazide sulfonyl ester compound or a 5-naphthoquinone diazide sulfonyl ester compound depending on the wavelength of the light used for exposure. The agent may contain a naphthoquinone diazide sulfonyl ester compound comprising both a 4-naphthoquinone diazide sulfonyl group and a 5-naphthoquinone diazide sulfonyl group in one molecule, or may contain both a 4-naphthoquinone diazide sulfonyl ester compound and a 5-naphthoquinone diazide sulfonyl ester compound.

Among the examples of the photoacid generating agent (b-1), the sulfonium salt, phosphonium salt, and diazonium salt are preferable because they can stabilize moderately the acid component produced by light exposure. The sulfonium salt is particularly preferable. In addition, a sensitization agent and the like may also be contained as necessary.

Examples of the photopolymerization initiator (b-2) include diethoxy acetophenone, 2-hydroxy-2-methyl-1-phenyl propane-1-one, benzyl dimethyl ketal, 1-(4-isopropyl phenyl)-2-hydroxy-2-methyl propane-1-one, 4-(2-hydroxyethoxy)phenyl-(2-hydroxy-2-propyl) ketone, 1-hydroxycyclohexyl-phenyl ketone, 1-phenyl-1,2-propanedione-2-(o-ethoxycarbonyl) oxime, 2-methyl-[4-(methyl thio)phenyl]-2-morpholinopropane-1-one, 2-benzyl-2-dimethyl amino-1-(4-morpholinophenyl)-butanone-1, benzoin, benzoin methyl ether, benzoin ethyl ether, benzoin isopropyl ether, benzoin isobutyl ether, benzophenone, methyl o-benzoylbenzoate, 4-phenyl benzophenone, 4,4-dichlorobenzophenone, hydroxybenzophenone, 4-benzoyl-4'-methyl-diphenyl sulfide, alkylated benzophenone, 3,3',4,4'-tetra(t-butylperoxy carbonyl)benzophenone, 4-benzoyl-N,N-dimethyl-N-[2-(1-oxo-2-propenyloxy)ethyl]benzene methanaminium bromide, (4-benzoyl benzyl)trimethyl-ammonium chloride, 2-hydroxy-3-(4-benzoyl phenoxy)-N,N,N-trimethyl-1-propene-aminium chloride monohydrate, 2-isopropyl thioxanthone, 2,4-dimethyl thioxanthone, 2,4-diethyl thioxanthone, 2,4-dichlorothioxanthone, 2-hydroxy-3-(3,4-dimethyl-9-oxo-9H-thioxanthene-2-yloxy)-N,N,N-trimethyl-1-propanaminium chloride, 2,4,6-trimethyl-benzoyl-phenyl-phosphine oxide, 1,2-octanedione-1-[4-(phenyl thio)-2-(O-benzoyloxime)], ethanone, 1-[9-ethyl-6-(2-methyl benzoyl)-9H-carbazole-3-yl]-, 1-(O-acetyl oxime), 2,2'-bis(o-chlorophenyl)-4,5,4',5'-tetraphenyl-1,2-bi-imidazole, 10-butyl-2-chloroacridone, 2-ethyl anthraquinone, benzyl, 9,10-phenanthrene quinone, camphor quinone, methyl-phenyl-glyoxylic ester, η5-cyclopentadienyl-η6-cumenyl-iron (1+)-hexafluorophosphate (1−), diphenyl sulfide derivatives, bis(η5-2,4-cyclopentadiene-1-yl)-bis(2,6-difluoro-3-(1H-pyrrole-1-yl)-phenyl) titanium, 4,4-bis(dimethyl amino)benzophenone, 4,4-bis(diethyl amino)benzophenone, thioxanthone, 2-methyl thioxanthone, 2-chlorothioxanthone, 4-benzoyl-4-methyl phenyl ketone, dibenzyl ketone, fluorenone, 2,3-diethoxy acetophenone, 2,2-dimethoxy-2-phenyl-2-phenyl acetophenone, 2-hydroxy-2-methyl propiophenone, p-t-butyl dichloroacetophenone, benzyl methoxy ethyl acetal, anthraquinone, 2-t-butyl anthraquinone, 2-aminoanthraquinone, β-chloroanthraquinone, anthrone, benzanthrone, dibenz-suberone, methylene anthrone, 4-azidobenzal acetophenone, 2,6-bis(p-azidobenzylidene)cyclohexane, 2,6-bis(p-azidobenzylidene)-4-methyl cyclohexanone, 2-phenyl-1,2-butadione-2-(o-methoxycarbonyl) oxime, 1,3-diphenyl propanetrione-2-(o-ethoxycarbonyl) oxime, naphthalene sulfonyl chloride, quinoline sulfonyl chloride, N-phenyl thioacridone, 4,4-azobisisobutyronitrile, benz-thiazole disulfide, triphenyl phosphine, carbon tetrabromide, tribromophenyl sulfone, benzoyl peroxide, and combinations of a photoreducing pigment such as eosin and methylene blue and a reducing agent such as ascorbic acid and triethanol amine. Two or more thereof may be contained.

Examples of the compound with two or more ethylenically unsaturated bonds (b-3) may include acrylic monomers such as ethylene glycol diacrylate, diethylene glycol diacrylate, triethylene glycol diacrylate, tetraethylene glycol diacrylate, ethylene glycol dimethacrylate, diethylene glycol dimethacrylate, triethylene glycol dimethacrylate, tetraethylene glycol dimethacrylate, ethylene oxide-modified bisphenol A diacrylate, ethylene oxide-modified bisphenol A dimethacrylate, trimethylolpropane diacrylate, trimethylolpropane triacrylate, trimethylolpropane dimethacrylate, trimethylolpropane trimethacrylate, 1,3-diisopropenylbenzene, 1,3-butanediol diacrylate, 1,3-butanediol dimethacrylate, neopentyl glycol diacrylate, 1,4-butanediol diacrylate, 1,4-butanediol dimethacrylate, 1,6-hexanediol diacrylate, 1,6-hexanediol dimethacrylate, 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, 1,3-acryloyloxy-2-hydroxypropane, 1,3-dimethacryloyloxy-2-hydroxypropane, methylene bisacrylamide, glycerin dimethacrylate, tripropylene glycol dimethacrylate, glycerin triacrylate, ethoxylated pentaerythritol tetraacrylate and ethoxylated isocyanuric acid triacrylate. Two or more thereof may be contained.

In the present invention, the content of the photosensitive agent (b) is preferably 0.05 to 50 parts by weight based on 100 parts by weight of the resin of the component (a). The content of the photoacid generating agent (b-1) is preferably 0.01 to 50 parts by weight based on 100 parts by weight of the resin of the component (a) for increasing the sensitivity. Among them, the quinone diazide compound preferably accounts for 3 to 40 parts by weight. The total content of the sulfonium salt, phosphonium salt and diazonium salt is preferably 0.5 to 20 parts by weight. The content of the photopolymerization initiator (b-2) is preferably 0.1 to 20 parts by weight based on 100 parts by weight of the resin of the component (a). When the content of the photopolymerization initiator (b-2) is 0.1 part by weight or more, an adequate number of radicals are formed by light irradiation to improve the sensitivity. When the content of the photopolymerization initiator (b-2) is 20 parts by weight or less, curing in unirradiated portions due to excessive radical formation does not take place and the alkaline developer works effectively. The content of the compound with two or more ethylenically unsaturated bonds (b-3) is preferably 5 to 50 parts by weight based on 100 parts by weight of the resin of the component (a).

For solubility adjustment and the like, a compound containing only one ethylenically unsaturated bond may be contained in an amount of 1 to 50 parts by weight based on 100 parts by weight of the resin of the component (a). Examples of the above-mentioned compound may include acrylate, methacrylate, methyl acrylate, methyl methacrylate, butyl acrylate, butyl methacrylate, isobutyl acrylate, hexyl acrylate, isooctyl acrylate, isobornyl acrylate, isobornyl methacrylate, cyclohexyl methacrylate, hydroxyethyl acrylate, hydroxyethyl methacrylate, N,N-dimethylaminoethyl acrylate, N,N-dimethylaminoethylmethacrylate, N,N-dimethyl acrylamide, N,N-dimethyl methacrylamide, N,N-dimethylaminopropyl acrylamide, N,N-dimethylaminopropyl methacrylamide, acryloyl morpholine, 2-hydroxyethyl methacrylate, 2-hydroxyethyl acrylate, 1-hydroxypropyl methacrylate, 1-hydroxypropyl acrylate, 2-hydroxypropyl methacrylate, 2-hydroxypropyl acrylate, 3-hydroxypropyl methacrylate, 3-hydroxypropyl acrylate, 1-hydroxy-1-methylethyl methacrylate, 1-hydroxy-1-methylethyl acrylate, 2-hydroxy-1-methylethyl methacrylate, 2-hydroxy-1-methylethyl acrylate, 1-hydroxybutyl methacrylate, 1-hydroxybutyl acrylate, 2-hydroxybutyl methacrylate, 2-hydroxybutyl acrylate, 3-hydroxybutyl methacrylate, 3-hydroxybutyl acrylate, 4-hydroxybutyl methacrylate, 4-hydroxybutyl acrylate, 1-hydroxy-1-methylpropyl methacrylate, 1-hydroxy-1-methylpropyl acrylate, 2-hydroxy-1-methylpropyl methacrylate, 2-hydroxy-1-methylpropyl acrylate, 1-hydroxy-2-methylpropyl methacrylate, 1-hydroxy-2-methylpropyl acrylate, 2-hydroxy-2-methylpropyl methacrylate, 2-hydroxy-2-methylpropyl acrylate, 2-hydroxy-1,1-dimethylethyl methacrylate, 2-hydroxy-1,1-dimethylethyl acrylate, 1,2-dihydroxypropyl methacrylate, 1,2-dihydroxypropyl acrylate, 2,3-dihydroxypropyl methacrylate, 2,3-dihydroxypropyl acrylate, 2,3-dihydroxybutyl methacrylate, 2,3-dihydroxybutyl acrylate, styrene, α-methylstyrene, 3-methylstyrene, 4-methylstyrene, 2-vinylnaphthalene, p-hydroxystyrene, p-isopropenylphenol, phenethyl methacrylate, phenethyl acrylate, N-methylol acrylamide, N-methylol methacrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, N-vinylpyrrolidone, N-vinylcaprolactam, crotonic acid, 4-pentenoic acid, 5-hexenoic acid, 6-heptenoic acid, 7-octenoic acid, 8-nonanoic acid, 9-decanoic acid, 10-undecylenic acid, brassidic acid, ricinoleic acid, 2-(methacryloyloxy)ethyl isocyanate and 2-(acryloyloxy)ethyl isocyanate.

Solvent (c)

The photosensitive resin composition of the present invention contains a solvent (c). Examples of the solvent include ethers such as ethylene glycol monomethyl ether, ethylene glycol monoethyl ether, propylene glycol monomethyl ether, propylene glycol monoethyl ether, diethylene glycol dimethyl ether and diethylene glycol ethylmethyl ether; esters such as ethylene glycol monomethyl ether acetate, propylene glycol monomethyl ether acetate, ethyl acetate, butyl acetate, methyl lactate, ethyl lactate and butyl lactate; alcohols such as ethanol, isopropanol, butanol, pentanol, 3-methyl-2-butanol and 3-methyl-3-methoxybutanol; ketones such as methyl ethyl ketone, methyl isobutyl ketone, methyl amyl ketone, diisobutyl ketone, cyclopentanone and diacetone alcohol; polar aprotic solvents such as N-methyl-2-pyrrolidone, γ-butyrolactone, N,N-dimethylformamide, N,N-dimethylacetamide, dimethyl sulfoxide and 1,3-dimethyl-2-imidazolidinone; and aromatic hydrocarbons such as toluene and xylene. Two or more thereof may be contained. The content of the solvent (c) is preferably 50 parts by weight or more, more preferably 100 parts by weight or more, and preferably 2000 parts by weight or less, more preferably 1500 parts by weight or less based on 100 parts by weight of the resin of the component (a).

The photosensitive resin composition of the present invention may contain components other than the components (a) to (c), and preferably contain a thermal crosslinking agent (d). Examples of the thermal crosslinking agent include alkoxymethyl group or methylol group-containing compounds (d-1) and epoxy group or oxetanyl group-containing compounds (d-2). Two or more thereof may be contained. The thermal crosslinking agent of the component (d) can improve chemical resistance of the cured film by undergoing a crosslinking reaction with the resin of the component (a) when heated.

The alkoxymethyl group or methylol group-containing compound (d-1) is preferably a compound represented by the general formula (6), or a compound having a group represented by the general formula (7), and they may be used in combination.

[Chemical compound 6]

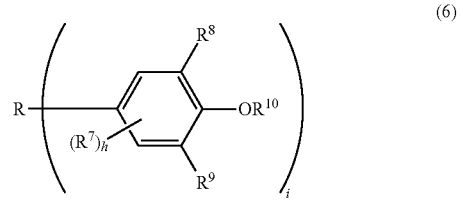

In the general formula (6), R represents a direct bond or a monovalent to tetravalent linking group. $R^7$ represents a monovalent organic group with a carbon number of 1 to 20, Cl, Br, I or F. The monovalent organic group with a carbon number of 1 to 20 is preferably a monovalent hydrocarbon group with a carbon number of 1 to 6, such as a methyl group, an ethyl group, a propyl group, a butyl group, a pentyl group, a hexyl group, a cyclopentyl group or a cyclohexyl group. $R^8$ and $R^9$ each represent $CH_2OR^{11}$ ($R^{11}$ is a hydrogen atom or a monovalent hydrocarbon group with a carbon number of 1 to 6). $R^{10}$ represents a hydrogen atom, a methyl group or an ethyl group. h represents an integer of 0 to 2, and i represents an integer of 1 to 4. When i is 2 to 4, $R^7$s to $R^{10}$s may be the same or different, respectively, but when one benzene ring has two $R^7$s, the $R^7$s are the same. Examples of the coupling group R are shown below.

[Chemical compound 7]

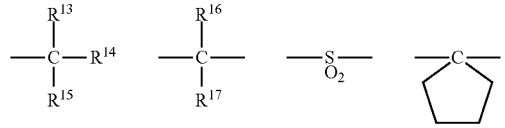

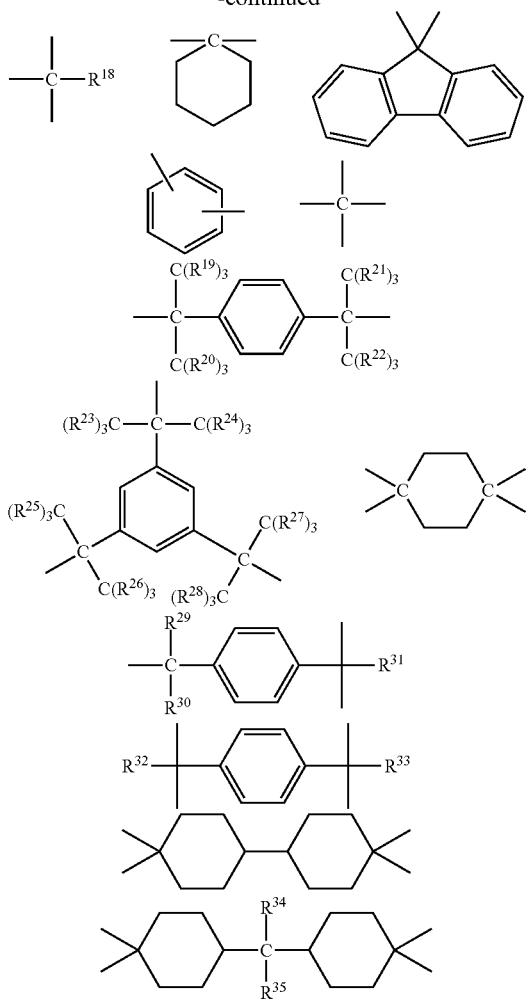

In the above formula, $R^{13}$ to $R^{35}$ each represent a hydrogen atom, a monovalent organic group with a carbon number of 1 to 20, Cl, Br, I or F. The monovalent, organic group with a carbon number of 1 to 20 is preferably a methyl group, an ethyl group, a propyl group, a butyl group, a pentyl group, a hexyl group, a cyclopentyl group, a cyclohexyl group, a benzyl group or a naphthyl group or the like.

 (7)

In the general formula (7), $R^{12}$ represents a hydrogen atom, or a monovalent hydrocarbon group with a carbon number of 1 to 6. j represents 1 or 2, and k represents 0 or 1, Here, j+k equals 1 or 2.

In the general formula (6), $R^8$ and $R^9$ each represent a thermal cross linkable group $CH_2OR^{11}$ ($R^{11}$ is a hydrogen atom or a monovalent hydrocarbon group with a carbon number of 1 to 6). To maintain moderate reactivity and excellent storage stability, $R^{11}$ is preferably a monovalent hydrocarbon group with a carbon number of 1 to 4. In the photosensitive resin composition containing a photoacid generating agent, $R^{11}$ is more preferably a methyl group or an ethyl group.

The number of functional groups of thermal crosslinkable groups per molecule in the compound represented by the general formula (6) is 2 to 8. For increasing the crosslinking density to improve mechanical properties, the number of functional groups is preferably 4 or larger. On the other hand, when the number of functional groups exceeds 8, it is difficult to obtain the compound with high purity, and the stability of the compound itself and the storage stability of the resin composition are deteriorated.

The purity of the compound represented by the general formula (6) is preferably 75% or more, more preferably 85% or more. When the purity is 85% or more, the crosslinking agent has excellent storage stability, and the crosslinking reaction can be carried out satisfactorily. Further, the number of unreacted groups that act as water absorbing groups can be decreased, so that the water absorbency of the resin composition can be reduced. Examples of the method for obtaining a thermal crosslinking agent with high purity include recrystallization and distillation. The purity of a thermal crosslinking agent can be determined by liquid chromatography.

Preferable examples of the compound represented by the general formula (6) are shown below.

[Chemical compound 8]

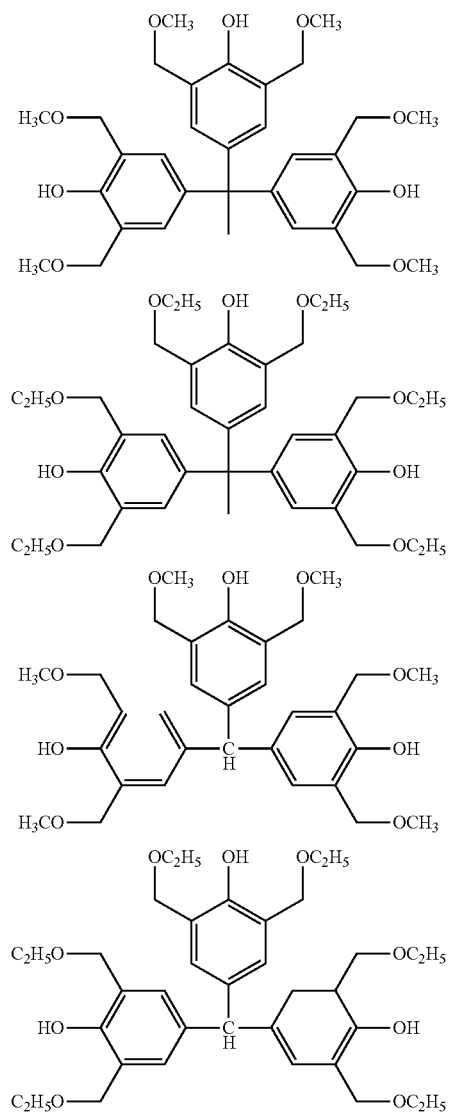

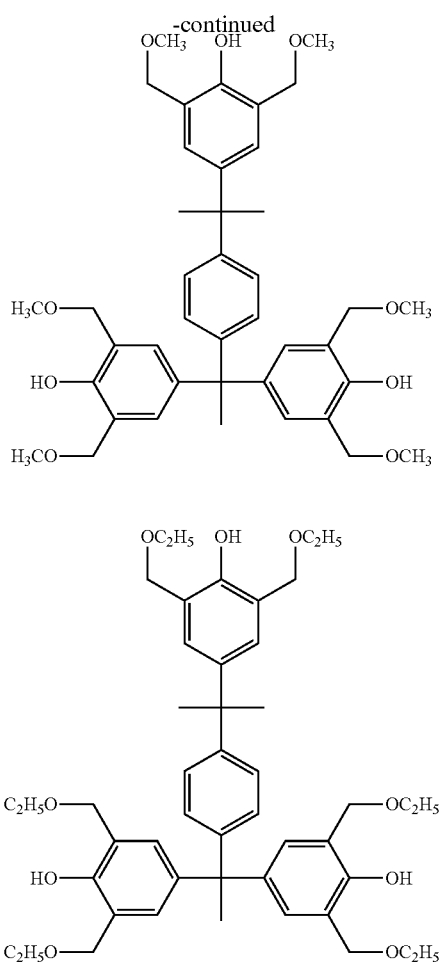

[Chemical compound 9]

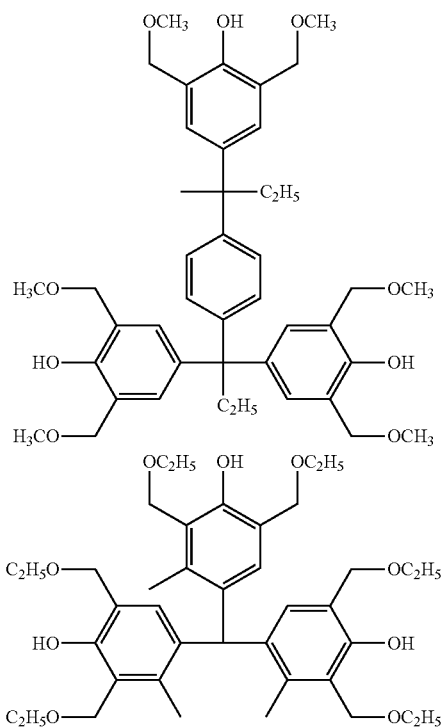

In the general formula (7), $R^{12}$ is a hydrogen atom or a hydrocarbon group with a carbon number of 1 to 6, and is preferably a monovalent hydrocarbon group with a carbon number of 1 to 4. From the viewpoint of stability of the compound and storage stability of the resin composition, $R^{12}$ is preferably a methyl group or an ethyl group, and the number of ($CH_2OR^{12}$) groups contained in the compound is preferably 8 or less in a photosensitive resin composition containing a photoacid generating agent.

Preferable examples of the thermal crosslinking agent having a group represented by the general formula (7) are shown below.

[Chemical compound 10]

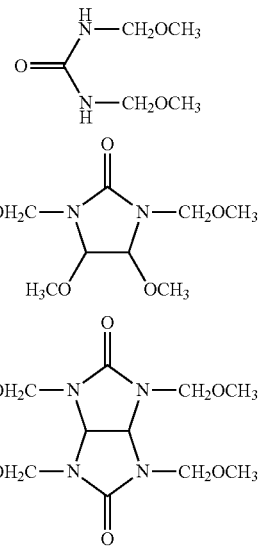

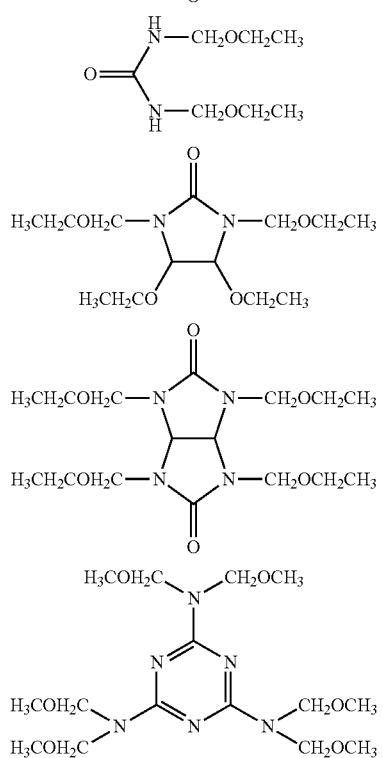

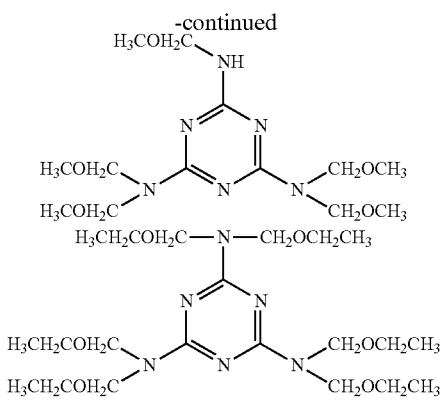

The epoxy group or oxetanyl group-containing compound (d-2) is preferably a compound containing two or more epoxy groups or oxetanyl groups per molecule from the viewpoint of the chemical resistance and heat resistance of the resulting cured film. Examples of the compound having two epoxy groups per molecule include "EPIKOTE" 807, "EPIKOTE" 828, "EPIKOTE" 1002, "EPIKOTE" 1750, "EPIKOTE" 1007, YX8100-BH30, E1256, E4250 and E4275 (trade names, manufactured by Japan Epoxy Resins Co., Ltd.); "EPICLON" EXA-4880, "EPICLON" EXA-4822, "EPICLON" EXA-9583 and HP 4032 (trade names, manufactured by DIC Corporation); "EPOLIGHT" 40E, "EPOLIGHT" 100E, "EPOLIGHT" 200E, "EPOLIGHT" 400E, "EPOLIGHT" 70P, "EPOLIGHT" 200P, "EPOLIGHT" 400P, "EPOLIGHT" 1500NP, "EPOLIGHT" 80 MF, "EPOLIGHT" 4000 and "EPOLIGHT" 3002 (trade names, manufactured by Kyoeisha Chemical Co., Ltd.); "DENACOL" EX-212L, "DENACOL" EX-214L, "DENACOL" EX-216L, "DENACOL" EX-252 and "DENACOL" EX-850L (trade names, manufactured by Nagase ChemteX Corporation); GAN and GOT (trade names, manufactured by Nippon Kayaku Co., Ltd.); "CELLOXIDE" 2021P (trade name, manufactured by Daicel Corporation); and "RIKARESIN" DME-100 and "RIKARESIN" BEO-60E (trade names, manufactured by New Japan Chemical Co., Ltd.).

Examples of the compound having three or more epoxy groups include VG 3101L (trade name, manufactured by Printec Corporation); "TEPIC" S, "TEPIC" G and "TEPIC" P (trade names, manufactured by Nissan Chemical Industries, Limited); "EPICLON" N660, "EPICLON" N695 and HP 7200 (trade names, manufactured by DIC Corporation); "DENACOL" EX-321L (trade name, manufactured by Nagase ChemteX Corporation); NC 6000, EPPN 502H and NC 3000 (trade names, manufactured by Nippon Kayaku Co., Ltd.); "EPOTOTE" YH-434L (trade name, manufactured by Tohto Kasei Co., Ltd.); and EHPE-3150 (trade name, manufactured by Daicel Corporation), and examples of the compound having two or more oxetanyl groups include OXT-121, OXT-221, OX-SQ-H, OXT-191, PNOX-1009 and RSOX (trade names, manufactured by Toagosei Company, Limited); and "ETERNACOLL" OXBP and "ETERNACOLL" OXTP (tradenames, manufactured by Ube Industries, Ltd.). The present invention is not limited thereto.

The content of the thermal crosslinking agent of the component (d) is preferably 5 parts by weight or more, more preferably 10 parts by weight or more based on 100 parts by weight of the resin of the component (a). When the content of the thermal crosslinking agent is 5 parts by weight or more, crosslinking density of the cured film is increased, so that chemical resistance is improved. Further, when the content of the thermal crosslinking agent is 10 parts by weight or more, chemical resistance is improved, and higher mechanical properties are obtained. On the other hand, the content of the thermal crosslinking agent is preferably 50 parts by weight or less, more preferably 40 parts by weight or less, further preferably 30 parts by weight or less from the viewpoint of the storage stability and mechanical strength of the composition. When two or more components (a) or components (d) are contained, the total content thereof is preferably in the above-described range.

The photosensitive resin composition of the present invention may contain a compound having a phenolic hydroxyl group (e). When a compound having a phenolic hydroxyl group is contained, the solubility of the resulting photosensitive resin composition in an aqueous alkali solution is improved, so that the sensitivity can be increased.

Examples of the compound having a phenolic hydroxyl group (e) include BisP-AF, BisP-AP, BisP-BA, Bis-Z, Ph-CC-AP, HDP-244, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (tetrakis P-DO-BPA), TrisP-HAP, TrisP-PA, TrisP-PHBA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetris-FR-CR, BisRS-26X and BisRS-OCHP (trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F and TEP-BIP-A (trade names, manufactured by Asahi Organic Chemicals Industry Co., Ltd.), 4,4'-sulfonyldiphenol, bisphenol F, 1,4-dihydroxy naphthalene, 1,5-dihydroxy naphthalene, 1,6-dihydroxy naphthalene, 1,7-dihydroxy naphthalene, 2,3-dihydroxy naphthalene, 2,6-dihydroxy naphthalene, 2,7-dihydroxy naphthalene, 2,4-dihydroxy quinoline, 2,6-dihydroxy quinoline, 2,3-dihydroxy quinoxaline, anthracene-1,2,10-triol, anthracene-1,8,9-triol and 8-quinolinol.

The content of the compound having a phenolic hydroxyl group (e) is preferably 1 to 40 parts by weight, more preferably 3 to 30 parts by weight based on 100 parts by weight of the resin of the component (a). Two or more components (e) may be contained, and when two or more components (e) are contained, the total content thereof is preferably in the above-described range.

The resin composition of the present invention may contain a thermal acid-forming agent. The thermal acid-forming agent works to generate an acid when heated after development as described later, promote the crosslinking reaction of the resin of the component (a) and the thermal crosslinking agent of the component (d), and promote cyclization of imide rings and oxazole rings. The chemical resistance of the cured film is hereby improved, so that the film loss can be reduced. The acid generated from the thermal acid-forming agent is preferably a strong acid, which is, for example, preferably an aryl sulfonic acid such as p-toluene sulfonic acid or benzene sulfonic acid, or an alkyl sulfonic acid such as methane sulfonic acid, ethane sulfonic acid or butane sulfonic acid. In the present invention, the thermal acid-forming agent is preferably an aliphatic sulfonic acid compound represented by the general formula (8) or (9), and two or more of such compounds may be contained.

[Chemical compound 11]

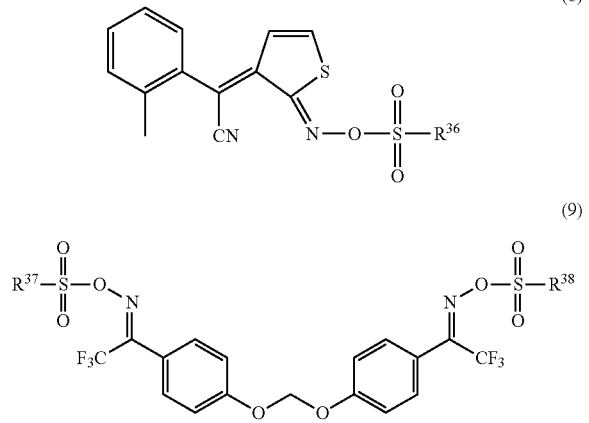

(8)

(9)

In the general formulae (8) and (9), $R^{36}$ to $R^{38}$ each represent an alkyl group with a carbon number of 1 to 10, or a monovalent aromatic group with a carbon number of 7 to 12. The alkyl group and the aromatic group may be substituted, and examples of the substituent include alkyl groups and carbonyl groups.

Specific examples of the compound represented by the general formula (8) may include the following compounds.

[Chemical compound 12]

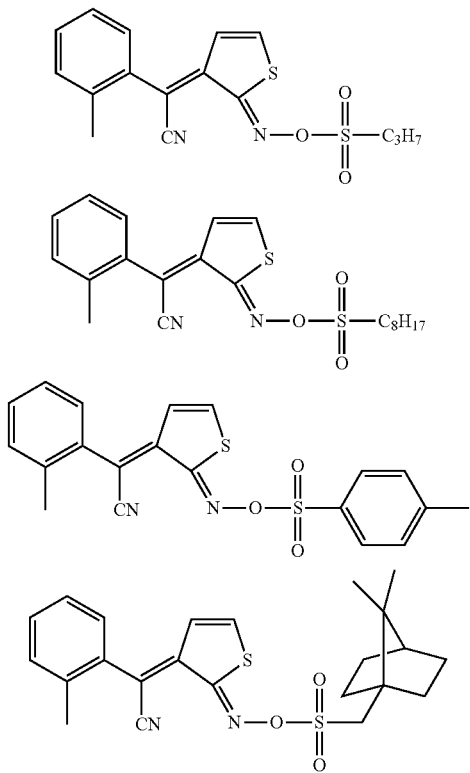

Specific examples of the compound represented by the general formula (9) may include the following compound.

[Chemical compound 13]

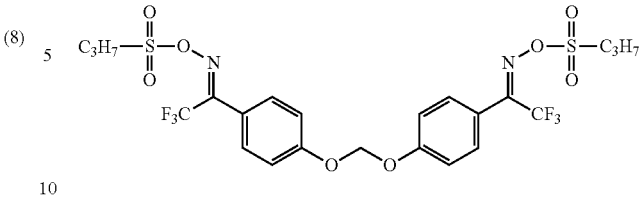

The content of the thermal acid-forming agent is preferably 0.1 part by weight or more, more preferably 0.3 part by weight or more, further more preferably 0.5 part by weight or more based on 100 parts by weight of the resin of the component (a) for further promoting the crosslinking reaction. On the other hand, the content of the thermal acid-forming agent is preferably 20 parts by weight or less, more preferably 15 parts by weight or less, further more preferably 10 parts by weight or less for retaining the electrical insulation properties of the cured film. When two or more thermal acid-forming agents are contained, the total content thereof is preferably in the above-described range.

The photosensitive resin composition of the present invention may contain a thermo-coloring compound that develops a color when heated and that shows an absorption maximum at 350 nm or more and 700 nm or less, and an organic pigment or dye that shows no absorption maximum at 350 nm or more and less than 500 nm but shows an absorption maximum at 500 nm or more and 750 nm or less. The thermo-coloring compound develops a color at a temperature of preferably 120° C. or higher, more preferably 150° C. or higher. As the thermo-coloring compound has a higher coloration temperature, the heat resistance under high temperature conditions is improved and the light resistance is also improved to prevent color degradation during prolonged ultraviolet-visible light irradiation.

Examples of the thermo-coloring compound include thermosensitive pigments, pressure-sensitive pigments, and hydroxyl-containing compounds having a triaryl methane backbone.

The photosensitive resin composition of the present invention may contain a contact improving agent. Examples of the contact improving agent include silane coupling agents such as vinyl trimethoxysilane, vinyl triethoxysilane, epoxy cyclohexyl ethyl trimethoxysilane, 3-glycidoxy propyl trimethoxysilane, 3-glycidoxy propyl triethoxysilane, p-styryl trimethoxysilane, 3-aminopropyl trimethoxysilane, 3-aminopropyl triethoxysilane and N-phenyl-3-aminopropyl trimethoxysilane; titanium chelate agents; aluminum chelate agents; and compounds obtained by reacting a aromatic amine compound with an alkoxy group-containing silicon compound. Two or more thereof may be contained. When such a contact improving agent is contained, contact with a substrate material such as silicon wafer, ITO, $SiO_2$ or silicon nitride can be increased during development of a photosensitive resin film, or the like. Further, resistance to oxygen plasma used for cleaning and to UV ozone processing can be improved. The content of the contact improving agent is preferably 0.1 to 10 parts by weight based on 100 parts by weight of the resin of the component (a).

The photosensitive resin composition of present invention may contain an adhesion improving agent. Examples of the adhesion improving agent include alkoxysilane-containing aromatic amine compounds, aromatic amide compounds and non-aromatic silane compounds. Two or more thereof may be contained. When such a compound is contained, adhesion with a substrate material after curing can be improved. Specific examples of the alkoxysilane-containing aromatic amine compound and aromatic amide compound are shown below. A compound obtained by reacting an aromatic amine compound with an alkoxy group-containing silicon compound may also be employed, and examples of the compound include compounds obtained by reacting an aromatic amine compound with an alkoxysilane compound having a group such as an epoxy group or a chloromethyl group that reacts with an amino group.

[Chemical compound 14]

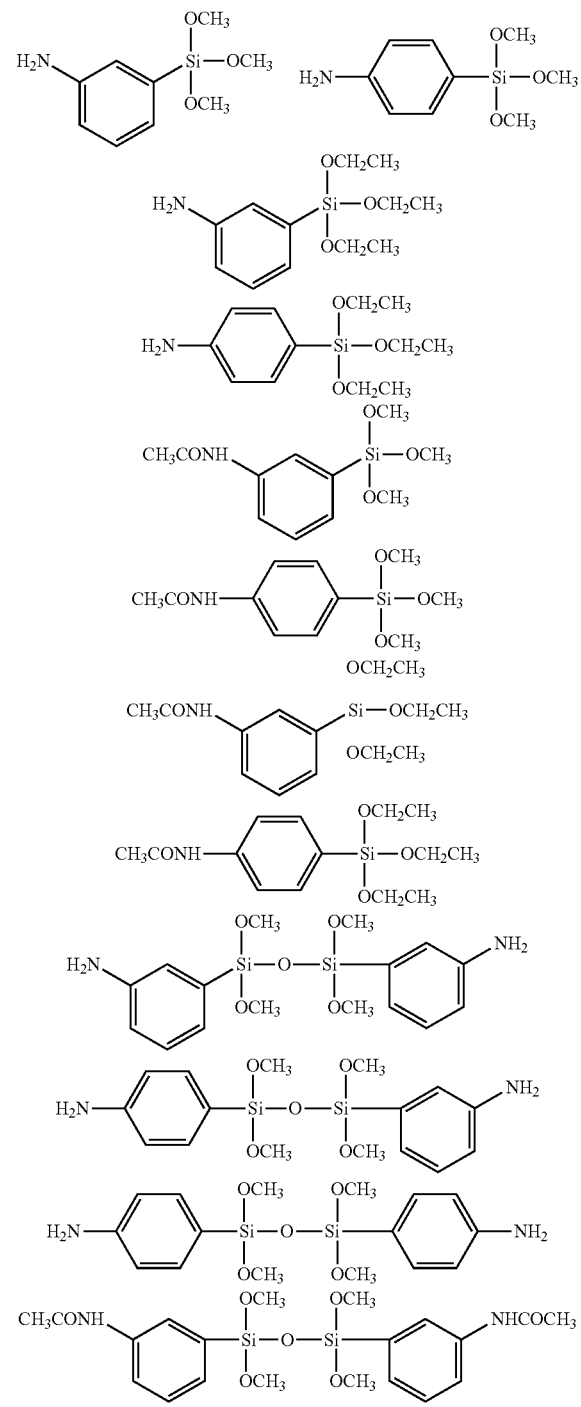

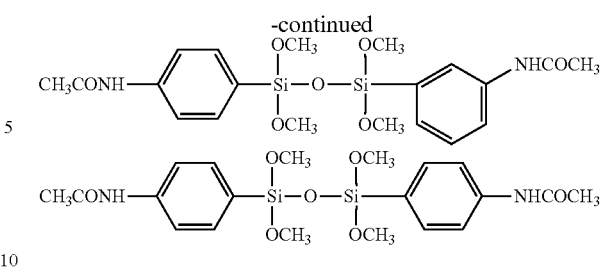

Examples of the non-aromatic silane compound include vinyl silane compounds such as vinyl trimethoxysilane, vinyl triethoxysilane, vinyl trichlorosilane and vinyl tris(β-methoxyethoxy)silane; and carbon-carbon unsaturated bond-containing silane compounds such as 3-methacryloxy propyl trimethoxysilane, 3-acryloxy propyl trimethoxysilane, p-styryl trimethoxysilane, 3-methacryloxy propyl methyl dimethoxysilane and 3-methacryloxy propyl methyl diethoxysilane. Among them, vinyl trimethoxysilane and vinyl triethoxysilane are preferable.

The total content of the alkoxysilane-containing aromatic amine compound, aromatic amide compound and non-aromatic silane compound is preferably 0.01 to 15 parts by weight based on 100 parts by weight of the resin of the component (a).

The photosensitive resin composition of present invention may contain inorganic particles. Preferable specific examples include, but are not limited to, silicon oxide, titanium oxide, barium titanate, alumina and talc. The primary particle size of the inorganic particles is preferably 100 nm or less, more preferably 60 nm or less.

The photosensitive resin composition of the present invention may contain a surface active agent, so that wettability with a substrate can be improved.

Examples of the surface active agent include fluorine-based surface active agents such as Fluorad (trade name, manufactured by Sumitomo 3M), Megafac (trade name, manufactured by DIC Corporation) and Surflon (trade name, manufactured by Asahi Glass Co., Ltd.); organic siloxane surface active agents such as KP341 (trade name, manufactured by Shin-Etsu Chemical Co., Ltd.), DBE (trade name, manufactured by Chisso Corporation), Polyflow and Glanol (trade names, manufactured by Kyoeisha Chemical Co., Ltd.) and BYK (trade name, manufactured by BYK-Chemie GmbH); and acrylic polymer surface active agents such as Polyflow (trade name, manufactured by Kyoeisha Chemical Co., Ltd.).

Described below is a method for producing the photosensitive resin composition of the present invention. For example, a photosensitive resin composition can be produced by uniformly mixing the components (a) to (c), and the components (d) and (e), a thermal acid-forming agent, a thermo-coloring compound, a contact improving agent, an adhesion improving agent, inorganic particles, a surface active agent and so on as necessary. Examples of the dissolution method include stirring and heating. When heating is performed, an appropriate heating temperature is selected preferably in a range, commonly from room temperature to 80° C., where a resin composition with unimpaired performance is obtained. There are no specific limitations on the order of dissolving these components, and for example, the compound with the lowest solubility may be dissolved first followed by others in the order of solubility. Dissolution of those components that are likely to form bubbles when dissolved by stirring, such as surface active agents and some contact improving agents, may be postponed to the other components, so that dissolution of the other components can be prevented from being hindered by bubble formation.

It is preferable that the resulting photosensitive resin composition is filtrated through a filter to remove dust and particles. Filters with a pore size of 0.02 to 0.5 μm, for example, 0.5 μm, 0.2 μm, 0.1 μm, 0.05 μm or 0.02 μm are available, although there are no specific limitations on the size. The filter to be used for filtration may be of such a material as polypropylene (PP), polyethylene (PE), nylon (NY), and polytetrafluoroethylene (PTFE), of which polyethylene and nylon are preferable. When the photosensitive resin composition contains inorganic particles, it is preferable to use a filter having a pore size larger than the particle size of the particles.

Described below is a method for producing a heat-resistant resin pattern (cured film) using the photosensitive resin composition of the present invention.

The photosensitive resin composition of the present invention is particularly suitable for slit coating as described above, but the coating method is not limited, and the photosensitive resin composition is applied by a spin coating method, a slit coating method, a dip coating method or a spray coating method, or a printing method such as an inkjet method or a nozzle coating method to obtain a photosensitive resin composition film. Prior to the coating step, the substrate to be coated with the photosensitive resin composition may be pre-treated with the contact improving agent. For example, a contact improving agent may be dissolved in an amount of 0.5 to 20% by weight in a solvent such as isopropanol, ethanol, methanol, water, tetrahydrofuran, propylene glycol monomethyl ether acetate, propylene glycol monomethyl ether, ethyl lactate and adipic acid diethyl to prepare a solution, which is then used to treat the substrate surface. Examples of the method for treating the substrate surface include spin coating, slit die coating, bar coating, dip coating, spray coating and steam processing. Vacuum drying may be carried out as needed, followed by heat treatment at 50° C. to 300° C. to accelerate the reaction between the substrate and the contact improving agent.

In an apparatus for applying the photosensitive resin composition of the present invention, a plurality of photosensitive resin compositions, i.e. the photosensitive resin composition of the present invention and photosensitive resin compositions other than the photosensitive resin composition of the present invention can be sequentially fed in one liquid feeding passage without cleaning the liquid feeding passage.

When a plurality types of photosensitive resin composition are sequentially fed in one liquid feeding passage, it is normally required to clean the liquid feeding passage with a solvent such as a thinner before feeding a next photosensitive resin composition for replacing a photosensitive resin composition. This is essential in the case where when a plurality of photosensitive resin compositions to be fed are mixed, solid components of at least one of the photosensitive resin compositions are precipitated, and unless cleaning is performed with a solvent such as a thinner, the solid component is precipitated in the liquid feeding passage to cause a problem. The cleaning in this case means that cleaning is performed using a cleaning liquid, the volume of which is equal to or larger than 10 times as large as the total volume of a liquid feeding pump, a liquid feeding line and a mouthpiece, extending from a liquid feeding tank to the tip of the mouthpiece. When the photosensitive resin composition of the present invention and a photosensitive resin composition other than the photosensitive resin composition of the present invention are sequentially fed, the former may precede, or the latter may precede.

Since the photosensitive resin composition of the present invention have excellent solubility in a low-polarity solvent, typically propylene glycol monomethyl ether acetate, a plurality of types of photosensitive resin compositions can be successively fed to replace one another without carrying out a cleaning step using a thinner.

The photosensitive resin composition other than the photosensitive resin composition of the present invention, among the plurality of types of photosensitive resin compositions, is not particularly limited, but when it contains a solvent having a polarity equivalent to or lower than that of a solvent used in the photosensitive resin composition of the present invention, the above-mentioned problem easily occurs, and therefore the method for producing a heat-resistant resin film according to the present invention is suitable. Examples of the photosensitive resin composition other than the photosensitive resin composition of the present invention include photosensitive resin compositions which contain at least one solvent selected from ethylene glycol monoethyl ether acetate, ethyl-3-ethoxy propionate, methyl-3-methoxy propionate, 2-heptanone, propylene glycol monomethyl ether acetate and cyclohexanone.

Next, the substrate coated with the photosensitive resin composition is dried to obtain a photosensitive resin film. Preferably, drying is performed at 50° C. to 150° C. for 1 minute to several hours using an oven, a hot plate, an infrared ray or the like.

Next, an actinic ray is applied onto the photosensitive resin film through a mask of an intended pattern. Actinic rays available for exposure include ultraviolet ray, visible light, electron beam, and X-ray, of which the i-line (365 nm), h-line (405 nm), and g-line (436 nm) of mercury lamp are preferred for the invention.

For forming a pattern on the photosensitive resin film, exposed portions may be removed using a developer after the exposure step. The developer is preferably an aqueous solution of tetramethyl ammonium, or an aqueous solution of an alkaline compound such as diethanol amine, diethyl aminoethanol, sodium hydroxide, potassium hydroxide, sodium carbonate, potassium carbonate, triethyl amine, diethyl amine, methyl amine, dimethyl amine, dimethylaminoethyl acetate, dimethyl aminoethanol, dimethylaminoethyl methacrylate, cyclohexyl amine, ethylene diamine or hexamethylene diamine. In some cases, one or more of polar solvents such as N-methyl-2-pyrolidone, N,N-dimethyl formamide, N,N-dimethyl acetamide, dimethyl sulfoxide, γ-butyrolactone and dimethyl acrylamide; alcohols such as methanol, ethanol and isopropanol; esters such as ethyl lactate and propylene glycol monomethyl ether acetate; and ketones such as cyclopentanone, cyclohexanone, isobutyl ketone and methyl isobutyl ketone may be added to these aqueous alkali solution. Commonly, rinsing in water is performed after the development step. Here again, a rinsing treatment may be performed using water containing an alcohol such as ethanol or isopropyl alcohol, an ester such as ethyl lactate or propylene glycol monomethyl ether acetate, or the like.

A cured film can be obtained by subjecting the resulting photosensitive resin composition film to a heat treatment. Examples of the available method include heat treatment at 230° C. for 60 minutes, heat treatment at 120 to 400° C. for 1 minute to 10 hours, heat treatment at a low temperature in the range from room temperature to about 100° C. after adding a curing catalyst and the like, and curing at a low temperature in the range from room temperature to about 100° C. by applying ultrasonic waves or electromagnetic waves.

Heat-resistant resin films (cured film) formed from the photosensitive resin composition of the present invention are suitably used as passivation films for semiconductors, protecting films for semiconductor devices, interlayer insulation films for multi-layer wiring for dense mounting, insulation films for organic EL devices and planarizing films for TFT substrates.

EXAMPLES

The present invention will be illustrated below with reference to Examples, but it should be understood that the invention is not construed as being limited thereto. The evaluations of photosensitive resin composition samples described in Examples and Comparative examples were carried out with the following methods.

(1) Solubility Evaluation of Resin in Organic Solvent

A polymer powder was added to PGMEA (propylene glycol monomethyl ether acetate) so as to achieve a solid content of 30% by weight, the mixture was stirred at room temperature for 1 hour, and the state thereof was visually observed to check presence/absence of an undissolved resin. Samples having no observable undissolved resin were rated "soluble", and samples having an observable undissolved resin were rated "unnecessary".

(2) Viscosity Evaluation (2-1) Polymer Solution Viscosity

A polymer powder was dissolved with a content of 30% by weight in PGMEA, and a viscosity of the solution was measured at 25° C. using an E-type viscometer. The viscosity of the polymer solution is preferably less than 150 mPa·s for ensuring that a viscosity suitable for slit coating is maintained even when the solid content in a photosensitive resin composition is increased.

As evaluation of suitability for formation of a uniform thick film by slit coating, samples were rated "A" when the polymer powder was dissolved with a content of 30% by weight in PGMEA, and the solution viscosity was less than 150 mPa·s, samples were rated "B" when the polymer powder was dissolved with a content of 30% by weight in PGMEA, but the solution viscosity was 150 mPa·s or more, and samples were rated "C" when the polymer powder was not dissolved with a content of 30% by weight in PGMEA.

(2-2) Varnish Solution Viscosity

The photosensitive resin composition (varnish) prepared in each of Examples and Comparative examples and having a solid content of 20% was measured at 25° C. using an E-type viscometer. For forming a film with a uniform thickness by slit coating, the solution viscosity is preferably 1 to 15 cp, more preferably 1 to 10 cp. Samples having a varnish viscosity of less than 10 cp at 25° C. were rated "S", samples having a varnish viscosity of 10 cp or more and less than 15 cp at 25° C. were rated "A", and samples having a varnish viscosity of 15 cp or more at 25° C. were rated "C".

When the solid content of the photosensitive resin composition is not 20%, the viscosity may be measured with the solid content adjusted to 20% by concentrating or diluting the photosensitive resin composition while a change in solvent composition of the photosensitive resin composition and degeneration of the photosensitive resin composition are prevented.

(3) Development Film Loss Amount Evaluation and Sensitivity Evaluation

Preparation of Development Film

The photosensitive resin composition (varnish) prepared in each of Examples and Comparative examples was applied onto an 8-inch silicon wafer by spin coating, and then heat-treated (pre-baked) at 120° C. for 2 minutes using a hotplate (Coating/Development. Apparatus Mark-7 manufactured by Tokyo Electron Ltd.) to prepare a pre-baked film having a thickness of 2.5 µm. The resulting pre-baked film was exposed at a step of 10 mJ/cm$^2$ in an exposure amount of 50 to 400 mJ/cm$^2$ using an i-line stepper (NSR-2005i9C manufactured by Nikon Corporation). After exposure, the film was subjected to post-exposure baking at 100° C. for 1 minute for the negative photosensitive resin composition. After exposure for the positive photosensitive resin composition and after post-exposure baking for the negative photosensitive resin composition, the film was developed for 60 seconds with a 2.38 wt % aqueous tetramethyl ammonium (TMAH) solution (ELM-D manufactured by MITSUBISHI GAS CHEMICAL COMPANY, INC.), and then rinsed with pure water to provide a development film.

Method for Measurement of Film Thickness

The film thickness after pre-baking and after development was measured at a refractive index of 1.63 using an optical interference type film thickness measurement apparatus LAMBDA ACE STM-602 manufactured by Dainippon Screen Mfg. Co., Ltd.

Calculation of Development Film Loss Amount

The development film loss amount was calculated in accordance with the following formula. Since the film thickness after pre-baking is 2.5 µm, the development film loss amount is preferably less than 0.50 µm. Samples with a development film loss amount of less than 0.50 µm were rated "A", samples with a development film loss amount of 0.51 to 0.59 µm were rated "B", and samples with a development film loss amount of 0.60 µm or more were rated "C".

development film loss amount (µm)=film thickness after pre-baking−film thickness after development Calculation of Sensitivity An exposure amount at which a line-and-space pattern (1L/1S) of 20 µm is formed with a width ratio of 1:1 after exposure and development (referred to as an optimum exposure amount Eop) was defined as a sensitivity. When the optimum exposure amount Eth is 200 mJ/cm$^2$ or less, it can be determined that the sensitivity is high. The optimum exposure amount is more preferably 150 mJ/cm$^2$ or less.

Abbreviations of acid dianhydrides, diamine compounds, end capping agents and solvents shown in Examples and Comparative examples below are as shown below.

6FDA: 2,2-bis(3,4-dicarboxyphenyl)hexafluoropropane dianhydride
OPDA: 3,3',4,4'-diphenyl ether tetracarboxylic dianhydride
BSAA: 2,2-bis[4-(3,4-dicarboxyphenoxyl)phenyl]propane dianhydride
BAHF: 2,2-bis(3-amino-4-hydroxyphenyl)hexafluoropropane
SiDA: 1,3-bis(3-aminopropyl)tetramethyl disiloxane
BIS-AT-AF: 2,2-bis(3-amino-4-methylphenyl)hexafluoropropane 3,3'-DDS: 3,3'-diaminodiphenyl sulfone
MAP: 3-aminophenol
ABP: 2-amino-4-tert-butylphenol
MA: maleic anhydride
DFA: N,N-dimethylformamide dimethylacetal
NMP: N-methyl-2-pyrolidone
PGMEA: propylene glycol monomethyl ether acetate
GBL: γ-butyrolactone The structures of 6FDA, ODPA, BSAA, BAHF, SiDA, BIS-AT-AF, 3,3'-DDS, MAP, ABP and MA are shown below.

[Chemical compound 15]

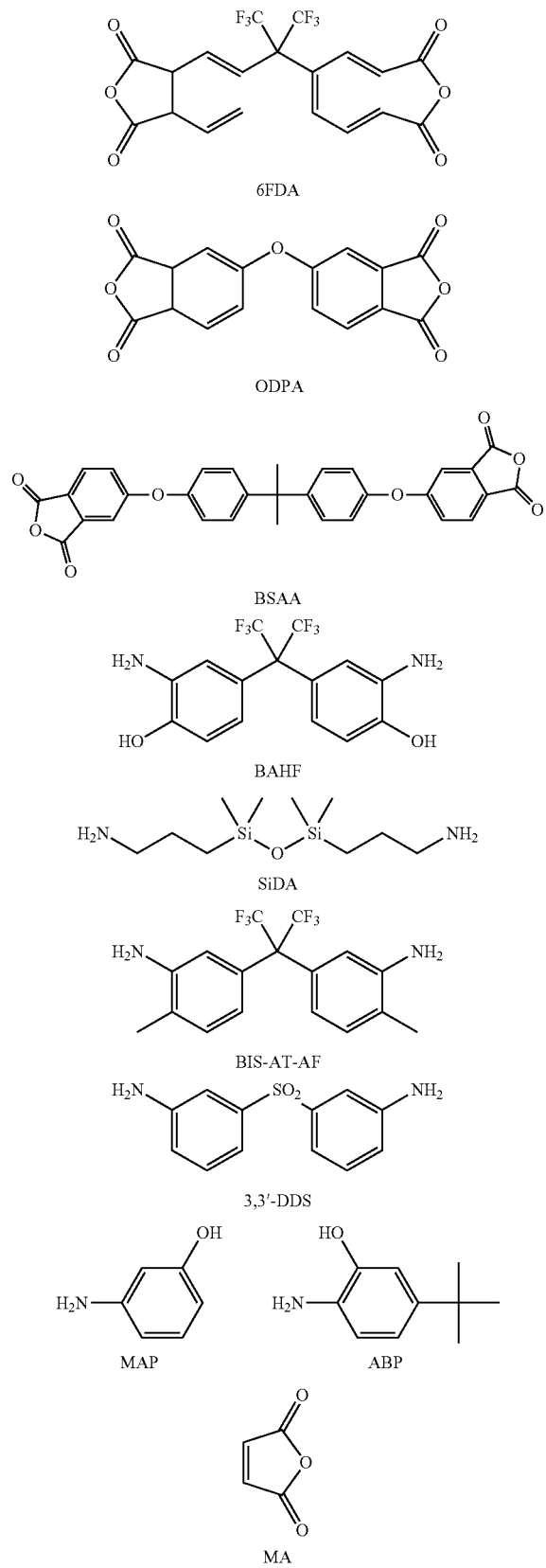

Synthesis Example 1: Synthesis of Diamine Compound (α)

18.3 g (0.05 mole) of BAHF (manufactured by Central Glass Co., Ltd.) was dissolved in 100 mL of acetone and 17.4 g (0.3 mole) of propylene oxide (manufactured by Tokyo Chemical Industry Co., Ltd.), and the solution was cooled to −15° C. Then, a solution of 20.4 g (0.11 mole) of 3-nitro benzoyl chloride (manufactured by Tokyo Chemical Industry Co., Ltd.) dissolved in 100 mL of acetone was added dropwise. After the end of dropwise addition, the solution was stirred at −15° C. for 4 hours, followed by leaving it to return to room temperature. The white solid precipitate was separated out by filtration and vacuum-dried at 50° C.

A 30 g portion of the resulting white solid was placed in a 300 mL stainless steel autoclave and dispersed in 250 mL of methyl cellosolve, followed by adding 2 g of 5% palladium-carbon (manufactured by Wako Pure Chemical Industries, Ltd.). Then, a balloon was used to introduce hydrogen into the dispersion to cause reduction reaction at room temperature. In about 2 hours, the reaction was finished after checking that the balloon would be deflated no more. After the end of the reaction, the solution was filtrated to remove the palladium compound used as a catalyst and concentrated with a rotary evaporator to provide a hydroxyl-containing diamine compound (α) as represented by the formula given below.

[Chemical compound 16]

(a)

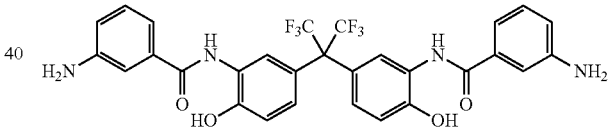

Synthesis Example 2: Synthesis of Quinone Diazide Compound (b-1)

In a dry nitrogen flow, 21.22 g (0.05 mole) of TrisP-PA (trade name, manufactured by Honshu Chemical Industry Co., Ltd.) and 26.8 g (0.1 mole) of 5-naphthoquinone diazide sulfonic acid chloride (NAC-5, manufactured by Toyo Gosei Co., Ltd.) were dissolved in 450 g of 1,4-dioxane, and the solution was kept at room temperature. To this solution, 12.65 g of triethyl amine mixed with 50 g of 1,4-dioxane was added dropwise while the system was kept at a temperature of lower than 35° C. After the dropwise addition, the solution was stirred at 40° C. for 2 hours. The triethylamine salt was filtered and the filtrate was put in water. Subsequently, the resulting precipitate was collected by filtration, and then washed in 1 L of 1% hydrochloric acid solution. Subsequently, the precipitate was further washed with 2 L of water twice. The precipitate was dried in a vacuum dryer to provide a quinone diazide compound (b-1) as represented by the following formula.

[Chemical compound 17]

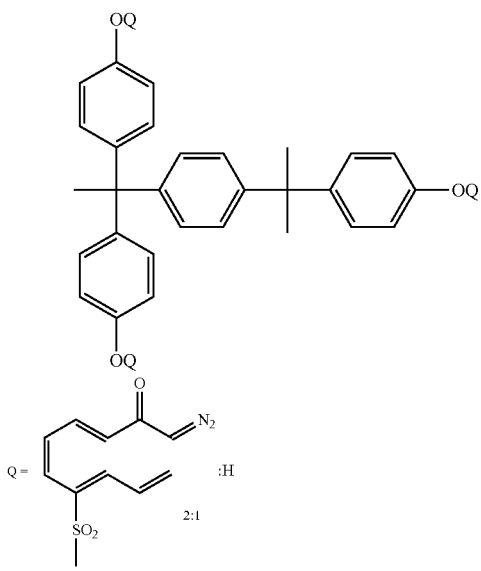

(b-1)

[Chemical compound 18]

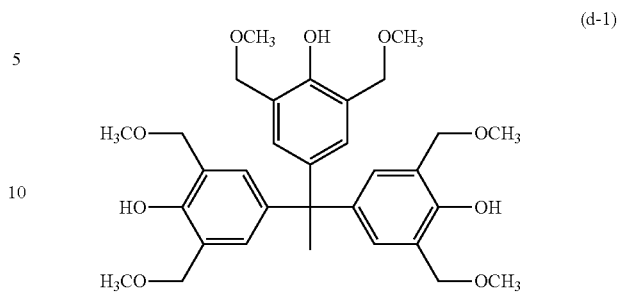

(d-1)

Other substances including the thermal crosslinking agent and phenolic hydroxyl group-containing compound used in Examples are as shown below.
Alkoxymethyl-containing thermal crosslinking agent (d-2): "NIKALAC (registered trademark)" MX-270
Thermal crosslinking agent (d-3): VG-3101 L
Phenol compound (e-1): BisP-AF

[Chemical compound 19]

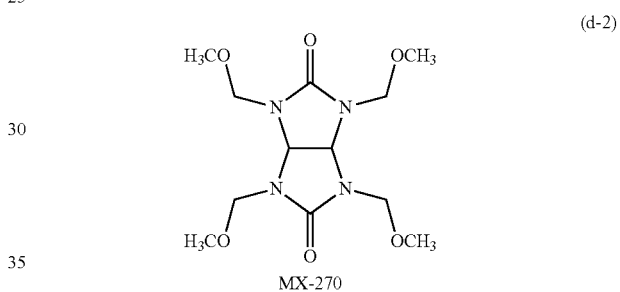

Synthesis Example 3: Synthesis of Alkoxymethyl-Containing Thermal Crosslinking Agent (d-1)

(1) 103.2 g (0.4 mole) of TrisP-HAP (trade name, manufactured by Honshu Chemical Industry Co., Ltd.) was dissolved in a solution of 80 g (2.0 mole) of sodium hydroxide in 800 g of pure water. After confirming complete dissolution, 686 g of a 36 to 38 wt % aqueous formalin solution was added dropwise at 20 to 25° C. for 2 hours. Subsequently, the mixture was stirred at 20 to 25° C. for 17 hours. It was neutralized by adding 98 g of sulfuric acid and 552 g of water, and left to stand for 2 days. After the standing period, the needle-like white crystal formed in the solution was collected by filtration and washed with 100 mL of water. The white crystal was vacuum-dried at 50° C. for 48 hours. The white crystal dried was analyzed with a high speed liquid chromatograph manufactured by Shimadzu Corporation at 254 nm using ODS as column and an acetonitrile/water (70/30) solution as developing solvent, and results showed that the starting materials had completely disappeared and the crystal had a purity of 92%. The crystal was analyzed further using NMR equipment (GX-270, manufactured by JEOL Ltd.) with a DMSO-d6 deuterated solvent, and results showed that it was hexamethylolated TrisP-HAP.

(2) Next, the compound thus obtained was dissolve in 300 mL of methanol, and 2 g of sulfuric acid was added, followed by stirring at room temperature for 24 hours. To this solution, 15 g of an anion exchange resin (Amberlyst IRA96SB manufactured by Rohm and Haas) was added and stirred for 1 hour, followed by filtering out the ion exchange resin. Subsequently, 500 mL of ethyl lactate was added and methanol was removed with a rotary evaporator to provide an ethyl lactate solution. This solution was left to stand at room temperature for 2 days to produce white crystal. The white crystal obtained was analyzed by high speed liquid chromatography and results showed that it was hexamethoxymethylated TrisP-HAP as represented by the following formula (alkoxymethyl-containing thermal crosslinking agent (d-1)) with a purity of 99%.

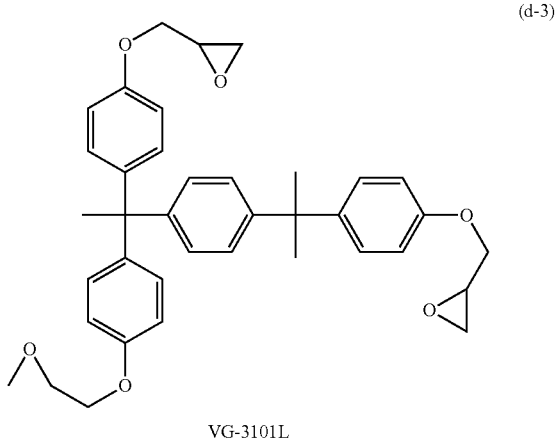

VG-3101L

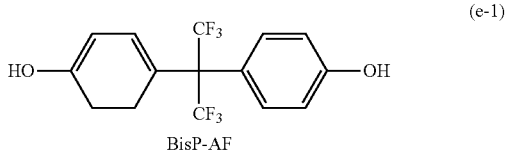

BisP-AF

Example 1

In a dry nitrogen flow, 15.1 g (0.025 mole) of the diamine compound (α) prepared in Synthesis example 1, 3.66 g (0.01 mole) of BAHF and 0.62 g (0.0025 mole) of SiDA (manufactured by Shin-Etsu Chemical Co., Ltd.) were dissolved in 200 g of NMP. Then, 22.2 g (0.05 mole) of 6FDA (manufactured by DAIKIN INDUSTRIES, Ltd.) was added along with 50 g of NMP, and the mixture was stirred at 40° C. for 1 hour. Subsequently, 2.73 g (0.025 mole) of MAP (manufactured by Tokyo Chemical Industry Co., Ltd.) was added, and the mixture was stirred at 40° C. for 1 hour. Further, a solution prepared by diluting 11.9 g (0.1 mole) of DFA (manufactured by Mitsubishi Rayon Co., Ltd.) with 5 g of NMP was added dropwise over 10 minutes, and after the dropwise addition, stirring was continued at 40° C. for 2 hours. After the end of stirring, the solution was put in 2 L of water, and the polymer solid precipitate was collected by filtration. Further, the precipitate was washed with 2 L of water three times, and the collected polymer solid material was dried in a vacuum dryer at 50° C. for 72 hours to provide a polyamide acid ester resin (A). Using the obtained resin (A), evaluation of solubility in an organic solvent and measurement of the viscosity of the polymer solution were performed by the above-described methods. The results are shown in Table 2. To 10 g of the obtained resin (A) were added 3.0 g of the quinone diazide compound (b-1) prepared in Synthesis example 2, 1.0 g of the phenol compound (e-1) and 50 g of GBL (manufactured by Mitsubishi Chemical Corporation) to provide a varnish (A-1) of a positive photosensitive resin composition. Using the varnish (A-1), the development film loss amount was evaluated as described above. The results are shown in Table 3.

Example 2

Except that 3.62 g (0.01 mole) of BIS-AT-AF (manufactured by Central Glass Co., Ltd.) was used in place of 3.66 g (0.01 mole) of BAHF, the same procedure as in Example 1 was carried out to provide a polyamide acid ester resin (B). Using the obtained resin (B), evaluation of solubility in an organic solvent and measurement of the viscosity of the polymer solution were performed by the above-described methods. The results are shown in Table 2.

Except that 10 g of the resin (B) prepared in the above procedure was added in place of the resin (A), and further, 1.0 g of the alkoxymethyl group-containing thermal crosslinking agent (d-1) prepared in Synthesis example 3 was added, the same procedure as in Example 1 was carried out to prepare a varnish (B) of a positive photosensitive resin composition. Using the obtained varnish (B), the development film loss amount was evaluated in the same manner as in Example 1. The results are shown in Table 3.

Example 3

Except that the amount of the diamine compound ($\alpha$) was changed from 15.1 g (0.025 mole) to 19.3 g (0.032 mole), the amount of BAHF was changed from 3.66 g (0.01 mole) to 2.01 g (0.0055 mole), and the amount of MAP was changed from 2.73 g (0.025 mole) to 2.18 g (0.02 mole), the same procedure as in Example 1 was carried out to provide a polyamide acid ester resin (C). Using the obtained resin (C), evaluation of solubility in an organic solvent and measurement of the viscosity of the polymer solution were performed by the above-described methods. The results are shown in Table 2.

Except that 10 g of the resin (C) prepared in the above procedure was added in place of the resin (A), and further, 0.5 g of the thermal crosslinking agent (d-2) was added, the same procedure as in Example 1 was carried out to prepare a varnish (C) of a positive photosensitive resin composition. Using the obtained varnish (C), the development film loss amount was evaluated in the same manner as in Example 1. The results are shown in Table 3.

Example 4

In a dry nitrogen flow, 22.2 g (0.05 mole) of 6FDA was dissolved in 200 g of NMP. Then, 6.60 g (0.04 mole) of ABP (manufactured by Tokyo Chemical Industry Co., Ltd.) was added, and the mixture was stirred at 40° C. for 1 hour. Subsequently, 9.06 g (0.015 mole) of the diamine compound ($\alpha$), 4.53 g (0.0125 mole) of BIS-AT-AF and 0.62 g (0.0025 mole) of SiDA were added along with 50 g of NMP, and the mixture was stirred at 40° C. for 2 hours. Further, a solution prepared by diluting 11.9 g (0.1 mole) of DFA with 5 g of NMP was added dropwise over 10 minutes, and after the dropwise addition, stirring was continued at 40° C. for 2 hours. After the end of stirring, the solution was put in 2 L of water, and the polymer solid precipitate was collected by filtration. Further, the precipitate was washed with 2 L of water three times, and the collected polymer solid material was dried in a vacuum dryer at 50° C. for 72 hours to provide a polyamide acid ester resin (D). Using the obtained resin (D), evaluation of solubility in an organic solvent and measurement of the viscosity of the polymer solution were performed by the above-described methods. The results are shown in Table 2.

Except that 10 g of the resin (D) prepared in the above procedure was added in place of the resin (A), and further, 0.5 g of the thermal crosslinking agent (d-3) was added, the same procedure as in Example 1 was carried out to prepare a varnish (D) of a positive photosensitive resin composition. Using the obtained varnish (D), the development film loss amount was evaluated in the same manner as in Example 1. The results are shown in Table 3.

Example 5

In a dry nitrogen flow, 21.2 g (0.035 mole) of the diamine compound ($\alpha$), 4.58 g (0.0125 mole) of BAHF and 0.62 g (0.0025 mole) of SiDA were dissolved in 200 g of NMP. Then, 13.3 g (0.03 mole) of 6FDA was added along with 50 g of NMP, and the mixture was stirred at 40° C. for 1 hour. Subsequently, 3.92 g (0.04 mole) of MA (manufactured by Wako Pure Chemical Industries, Ltd.) was added, and the mixture was stirred at 40° C. for 1 hour. Further, a solution prepared by diluting 11.9 g (0.1 mole) of DFA with 5 g of NMP was added dropwise over 10 minutes, and after the dropwise addition, stirring was continued at 40° C. for 2 hours. After the end of stirring, the solution was put in 2 L of water, and the polymer solid precipitate was collected by filtration. Further, the precipitate was washed with 2 L of water three times, and the collected polymer solid material was dried in a vacuum dryer at 50° C. for 72 hours to provide a polyamide acid ester resin (E). Using the obtained resin (E), evaluation of solubility in an organic solvent and measurement of the viscosity of the polymer solution were performed by the above-described methods. The results are shown in Table 2. Except that 10 g of the resin (E) prepared in the above procedure was added in place of the resin (A), and further, 1.0 g of the thermal crosslinking agent (d-1) was added, the same procedure as in Example 1 was carried out to prepare a varnish (E) of a positive photosensitive resin composition. Using the obtained varnish (E), the development film loss amount was evaluated in the same manner as in Example 1. The results are shown in Table 3.

Example 6

Except that the amount of the diamine compound ($\alpha$) was changed from 21.2 g (0.035 mole) to 25.7 g (0.0425 mole), the amount of BAHF was changed from 4.58 g (0.0125 mole) to 1.83 g (0.005 mole), the amount of 6FDA was changed from 13.3 g (0.03 mole) to 16.7 g (0.0375 mole), and the amount of MA was changed from 3.92 g (0.04 mole) to 2.45 g (0.025 mole), the same procedure as in Example 5 was carried out to provide a polyamide acid ester resin (F). Using the obtained resin (F), evaluation of solubility in an organic solvent and measurement of the viscosity of the polymer solution were performed by the above-described methods. The results are shown in Table 2.

Except that 10 g of the resin (F) prepared in the above procedure was added in place of the resin (A), and further, 0.5 g of the thermal crosslinking agent (d-2) was added, the same procedure as in Example 1 was carried out to prepare a varnish (F) of a positive photosensitive resin composition. Using the obtained varnish (F), the development film loss amount was evaluated in the same manner as in Example 1. The results are shown in Table 3.

Example 7

In a dry nitrogen flow, 15.1 g (0.025 mole) of the diamine compound (α), 8.24 g (0.0225 mole) of BAHF and 0.62 g (0.0025 mole) of SiDA were dissolved in 200 g of NMP. Then, 4.90 g (0.05 mole) of MA was added along with 50 g of NMP, and the mixture was stirred at 40° C. for 1 hour. Subsequently, 11.1 g (0.025 mole) of 6FDA was added, and the mixture was stirred at 40° C. for 2 hours. Further, a solution prepared by diluting 11.9 g (0.1 mole) of DFA with 5 g of NMP was added dropwise over 10 minutes, and after the dropwise addition, stirring was continued at 40° C. for 2 hours. After the end of stirring, the solution was put in 2 L of water, and the polymer solid precipitate was collected by filtration. Further, the precipitate was washed with 2 L of water three times, and the collected polymer solid material was dried in a vacuum dryer at 50° C. for 72 hours to provide a polyamide acid ester resin (G). Using the obtained resin (G), evaluation of solubility in an organic solvent and measurement of the viscosity of the polymer solution were performed by the above-described methods. The results are shown in Table 2.

Except that 10 g of the resin (G) prepared in the above procedure was added in place of the resin (A), and further, 0.5 g of the thermal crosslinking agent (d-3) was added, the same procedure as in Example 1 was carried out to prepare a varnish (G) of a positive photosensitive resin composition. Using the obtained varnish (G), the development film loss amount was evaluated in the same manner as in Example 1. The results are shown in Table 3.

Example 8

To 10 g of the resin (A) prepared in Example 1, 0.1 g of 1,2-octanedione-1-[4-(phenyl thio)-2-(O-benzoyloxime)] (ODPTBO) (manufactured by BASF Japan Ltd.), 2.0 g of ethylene oxide modified bisphenol A dimethacrylate (NK Ester BPE-100 manufactured by Shin-Nakamura Chemical Co., Ltd.), 0.5 g of trimethylolpropane triacrylate (TPT), 1.0 g of the alkoxymethyl group-containing thermal crosslinking agent (d-3) prepared in Synthesis example 3, and 50 g of GBL were added to provide a varnish (A-2) of a negative photosensitive resin composition. Using the obtained varnish (A-2), the development film loss amount was evaluated as described above. The results are shown in Table 2.

Example 9

Except that the amount of BAHF was changed from 2.01 g (0.0055 mole) to 2.93 g (0.008 mole), and the amount of MAP was changed from 2.18 g (0.02 mole) to 1.63 g (0.015 mole), the same procedure as in Example 3 was carried out to provide a polyamide acid ester resin (H). Using the obtained resin (H), evaluation of solubility in an organic solvent and measurement of the viscosity of the polymer solution were performed by the above-described methods. The results are shown in Table 2.

Except that 10 g of the resin (H) prepared in the above procedure was added in place of the resin (A), the same procedure as in Example 3 was carried out to prepare a varnish (H) of a positive photosensitive resin composition. Using the obtained varnish (H), solubility in an organic solvent, the viscosity of the polymer solution and the development film loss amount were evaluated in the same manner as in Example 3. The results are shown in Table 3.

Example 10

Except that the amount of BIS-AT-AF was changed from 4.53 g (0.0125 mole) to 3.62 g (0.01 mole), and the amount of ABP was changed from 6.60 g (0.04 mole) to 7.43 g (0.045 mole), the same procedure as in Example 4 was carried out to provide a polyamide acid ester resin (I). Using the obtained resin (I), evaluation of solubility in an organic solvent and measurement of the viscosity of the polymer solution were performed by the above-described methods. The results are shown in Table 2.

Except that 10 g of the resin (I) prepared in the above procedure was added in place of the resin (A), the same procedure as in Example 4 was carried out to prepare a varnish (I) of a positive photosensitive resin composition. Using the obtained varnish (I), the development film loss amount was evaluated in the same manner as in Example 4. The results are shown in Table 3.

Example 11

Except that the amount of 6FDA was changed from 16.7 g (0.0375 mole) to 17.8 g (0.04 mole), and the amount of MA was changed from 2.45 g (0.025 mole) to 1.96 g (0.02 mole), the same procedure as in Example 6 was carried out to provide a polyamide acid ester resin (J). Using the obtained resin (J), evaluation of solubility in an organic solvent and measurement of the viscosity of the polymer solution were performed by the above-described methods. The results are shown in Table 2.

Except that 10 g of the resin (J) prepared in the above procedure was added in place of the resin (A), the same procedure as in Example 6 was carried out to prepare a varnish (J) of a positive photosensitive resin composition. Using the obtained varnish (J), the development film loss amount was evaluated in the same manner as in Example 6. The results are shown in Table 3.

Example 12

Except that the amount of 6FDA was changed from 11.1 g (0.025 mole) to 9.99 g (0.0225 mole), and the amount of MA was changed from 4.90 g (0.05 mole) to 5.39 g (0.055 mole), the same procedure as in Example 7 was carried out to provide a polyamide acid ester resin (K). Using the obtained resin (K), evaluation of solubility in an organic solvent and measurement of the viscosity of the polymer solution were performed by the above-described methods. The results are shown in Table 2.

Except that 10 g of the resin (K) prepared in the above procedure was added in place of the resin (A), the same procedure as in Example 7 was carried out to prepare a varnish (K) of a positive photosensitive resin composition. Using the obtained varnish (K), the development film loss amount was evaluated in the same manner as in Example 7. The results are shown in Table 3.

Comparative Example 1

Except that 15.5 g (0.05 mole) of ODPA (manufactured by Manac Incorporated) was used in place of 22.2 g (0.05 mole) of 6FDA, the same procedure as in Example 1 was carried out to provide a polyamide acid ester resin (L). Using the obtained resin (L), evaluation of solubility in an organic solvent and measurement of the viscosity of the polymer solution were performed by the above-described methods. The results are shown in Table 2.

Except that 10 g of the resin (L) prepared in the above procedure was added in place of the resin (A), the same procedure as in Example 1 was carried out to prepare a varnish (L) of a positive photosensitive resin composition. Using the obtained varnish (L), the development film loss amount was evaluated in the same manner as in Example 1. The results are shown in Table 3.

Comparative Example 2

Except that the amount of the diamine compound (α) was changed from 15.1 g (0.025 mole) to 21.2 g (0.035 mole), and BAHF was not added, the same procedure as in Example 1 was carried out to provide a polyamide acid ester resin (M). Using the obtained resin (M), evaluation of solubility in an organic solvent and measurement of the viscosity of the polymer solution were performed by the above-described methods. The results are shown in Table 2.

Except that 10 g of the resin (M) prepared in the above procedure was added in place of the resin (A), the same procedure as in Example 1 was carried out to prepare a varnish (M) of a positive photosensitive resin composition. Using the obtained varnish (M), the development film loss amount was evaluated in the same manner as in Example 1. The results are shown in Table 3.

Comparative Example 3

Except that 2.48 g (0.01 mole) of 3,3'-DDS (manufactured by MITSUI FINE CHEMICALS, Inc.) was used in place of 3.66 g (0.01 mole) of BAHF, the same procedure as in Example 1 was carried out to provide a polyamide acid ester resin (N). Using the obtained resin (N), evaluation of solubility in an organic solvent and measurement of the viscosity of the polymer solution were performed by the above-described methods. The results are shown in Table 2.

Except that 10 g of the resin (N) prepared in the above procedure was added in place of the resin (A), the same procedure as in Example 1 was carried out to prepare a varnish (N) of a positive photosensitive resin composition. Using the obtained varnish (N), the development film loss amount was evaluated in the same manner as in Example 1. The results are shown in Table 3.

Comparative Example 4

Except that 6.20 g (0.025 mole) of 3,3'-DDS was used in place of 15.1 g (0.025 mole) of the diamine compound (α), the same procedure as in Example 1 was carried out to provide a polyamide acid ester resin (O). Using the obtained resin (O), evaluation of solubility in an organic solvent and measurement of the viscosity of the polymer solution were performed by the above-described methods. The results are shown in Table 2.

Except that 10 g of the resin (O) prepared in the above procedure was added in place of the resin (A), the same procedure as in Example 1 was carried out to prepare a varnish (O) of a positive photosensitive resin composition. Using the obtained resin (O) and varnish (O), the development film loss amount was evaluated in the same manner as in Example 1. The results are shown in Table 3.

Comparative Example 5

Except that the amount of the diamine compound (α) was changed from 15.1 g (0.025 mole) to 6.05 g (0.01 mole), and the amount of BAHF was changed from 3.66 g (0.01 mole) to 9.15 g (0.025 mole), the same procedure as in Example 1 was carried out to provide a polyamide acid ester resin (P). Using the obtained resin (P), evaluation of solubility in an organic solvent and measurement of the viscosity of the polymer solution were performed by the above-described methods. The results are shown in Table 2.

Except that 10 g of the resin (P) prepared in the above procedure was added in place of the resin (A), the same procedure as in Example 1 was carried out to prepare a varnish (P) of a positive photosensitive resin composition. Using the obtained varnish (P), the development film loss amount was evaluated in the same manner as in Example 1. The results are shown in Table 3.

Comparative Example 6

Except that the amount of the diamine compound (α) was changed from 21.2 g (0.035 mole) to 28.7 g (0.0475 mole), and BAHF was not added, the same procedure as in Example 5 was carried out to provide a polyamide acid ester resin (Q). Using the obtained resin (Q), evaluation of solubility in an organic solvent and measurement of the viscosity of the polymer solution were performed by the above-described methods. The results are shown in Table 2.

Except that 10 g of the resin (Q) prepared in the above procedure was added in place of the resin (A), the same procedure as in Example 1 was carried out to prepare a varnish (Q) of a positive photosensitive resin composition. Using the obtained varnish (Q), the development film loss amount was evaluated in the same manner as in Example 1. The results are shown in Table 3.

Comparative Example 7

In a dry nitrogen flow, 24.2 g (0.04 mole) of the diamine compound (α) and 0.62 g (0.0025 mole) of SiDA were dissolved in 250 g of NMP. Then, 22.2 g (0.05 mole) of 6FDA was added along with 50 g of NMP, and the mixture was stirred at 30° C. for 2 hours. Subsequently, 1.09 g (0.01 mole) of MAP was added, and the mixture was stirred at 40° C. for 2 hours. Further, 2.5 g of pyridine (manufactured by Tokyo Chemical Industry Co., Ltd.) was diluted with 15 g of toluene (manufactured by Tokyo Chemical Industry Co., Ltd.) and added to the solution, which was then heated for reaction at 120° C. for 2 hours and subsequently at 180° C. for 2 hours, with a cooling pipe provided to remove water out of the reaction system by azeotropy with toluene. The solution was cooled down to room temperature and poured in 2 L of water, and the polymer solid precipitate was collected by filtration. Further, the precipitate was washed with 2 L of water three times, and the collected polymer solid material was dried in a vacuum dryer at 50° C. for 72 hours to provide a polyimide resin (R). Using the obtained resin (R), evaluation of solubility in an organic solvent and measurement of the viscosity of the polymer solution were performed by the above-described methods. The results are shown in Table 2.

Except that 10 g of the resin (R) prepared in the above procedure was added in place of the resin (A), the same procedure as in Example 1 was carried out to prepare a varnish (R) of a positive photosensitive resin composition. Using the obtained varnish (R), the development film loss amount was evaluated in the same manner as in Example 1. The results are shown in Table 3.

Comparative Example 8

Except that 24.2 g (0.04 mole) of the diamine compound (α) was changed to 10.4 g (0.0285 mole) of BAHF, the amount of MAP was changed from 1.09 g (0.01 mole) to 4.09 g (0.0375 mole), and 22.2 g (0.05 mole) of 6FDA was changed to 15.5 g (0.05 mole) of ODPA, the same procedure as in Comparative example 7 was carried out to provide a polyimide resin (S). Using the obtained resin (S), evaluation of solubility in an organic solvent and measurement of the viscosity of the polymer solution were performed by the above-described methods. The results are shown in Table 2.

Except that 10 g of the resin (S) prepared in the above procedure was added in place of the resin (A), the same procedure as in Example 1 was carried out to prepare a varnish (S) of a positive photosensitive resin composition. Using the obtained varnish (S), the development film loss amount was evaluated in the same manner as in Example 1. The results are shown in Table 3.

Comparative Example 9

In a dry nitrogen flow, 12.1 g (0.02 mole) of the diamine compound (α), 8.24 g (0.0225 mole) of BAHF and 0.62 g (0.0025 mole) of SiDA were dissolved in 200 g of NMP. Then, 6.66 g (0.015 mole) of 6FDA and 10.9 g (0.035 mole) of ODPA were added along with 50 g of NMP, and the mixture was stirred at 40° C. for 2 hours. Subsequently, a solution prepared by diluting 11.9 g (0.1 mole) of DFA with 5 g of NMP was added dropwise over 10 minutes, and after the dropwise addition, stirring was continued at 40° C. for 2 hours. After the end of stirring, the solution was put in 2 L of water, and the polymer solid precipitate was collected by filtration. Further, the precipitate was washed with 2 L of water three times, and the collected polymer solid material was dried in a vacuum dryer at 50° C. for 72 hours to provide a polyamide acid ester resin (T). Using the obtained resin (T), evaluation of solubility in an organic solvent and measurement of the viscosity of the polymer solution were performed by the above-described methods. The results are shown in Table 2.

Except that 10 g of the resin (T) prepared in the above procedure was added in place of the resin (A), the same procedure as in Example 1 was carried out to prepare a varnish (T) of a positive photosensitive resin composition. Using the obtained varnish (T), the development film loss amount was evaluated in the same manner as in Example 1. The results are shown in Table 3.

Comparative Example 10

Except that the amount of the diamine compound (α) was changed from 12.1 g (0.02 mole) to 19.3 g (0.032 mole), the amount of BAHF was changed from 8.24 g (0.0225 mole) to 2.01 g (0.0055 mole), the amount of 6FDA was changed from 6.66 g (0.15 mole) to 15.5 g (0.035 mole), and 7.81 g (0.015 mole) of BSAA (manufactured by SABIC Japan Ltd.) was used in place of 10.9 g (0.035 mole) of ODPA, the same procedure as in Comparative example 9 was carried out to provide a polyamide acid ester resin (U). Using the obtained resin (U), evaluation of solubility in an organic solvent and measurement of the viscosity of the polymer solution were performed by the above-described methods. The results are shown in Table 2.

Except that 10 g of the resin (U) prepared in the above procedure was added in place of the resin (A), the same procedure as in Example 1 was carried out to prepare a varnish (U) of a positive photosensitive resin composition. Using the obtained varnish (U), solubility in an organic solvent, the viscosity of the polymer solution and the development film loss amount were evaluated in the same manner as in Example 1. The results are shown in Tables 1 and 2.

Compositions of monomers and end capping agents used for the resins A to U used in Examples and Comparative examples are shown in Table 1, and results of evaluation of the solubility in an organic solvent and the polymer solution viscosity for the resins A to U are shown in Table 2. Compositions of varnishes and results of evaluation of the development film loss amount in Examples and Comparative examples are shown in Table 3.

TABLE 1

| | Composition of monomer and end capping agent | | | | | | | | |
|---|---|---|---|---|---|---|---|---|---|
| | Acid dianhydride (molar ratio) | | | Formula (2) in $R^1$ | Diamine (molar ratio) | | | | |
| Resin | 6FDA | ODPA | BSAA | mol % | α | BAHF | BIS-AT-AF | DDS | SiDA |
| Resin (A) polyamide acid ester | 100 | 0 | 0 | 100 | 50 | 20 | 0 | 0 | 5 |
| Resin (B) polyamide acid ester | 100 | 0 | 0 | 100 | 50 | 0 | 20 | 0 | 5 |
| Resin (C) polyamide acid ester | 100 | 0 | 0 | 100 | 64 | 11 | 0 | 0 | 5 |
| Resin (D) polyamide acid ester | 100 | 0 | 0 | 100 | 30 | 0 | 25 | 0 | 5 |

TABLE 1-continued

| Resin | | | | | | | | | |
|---|---|---|---|---|---|---|---|---|---|
| Resin (E) polyamide acid ester | 60 | 0 | 0 | 100 | 70 | 25 | 0 | 0 | 5 |
| Resin (F) polyamide acid ester | 75 | 0 | 0 | 100 | 85 | 10 | 0 | 0 | 5 |
| Resin (G) polyamide acid ester | 50 | 0 | 0 | 100 | 50 | 45 | 0 | 0 | 5 |
| Resin (H) polyamide acid ester | 100 | 0 | 0 | 100 | 64 | 16 | 0 | 0 | 5 |
| Resin (I) polyamide acid ester | 100 | 0 | 0 | 100 | 30 | 0 | 20 | 0 | 5 |
| Resin (J) polyamide acid ester | 80 | 0 | 0 | 100 | 85 | 10 | 0 | 0 | 5 |
| Resin (K) polyamide acid ester | 45 | 0 | 0 | 100 | 50 | 45 | 0 | 0 | 5 |
| Resin (L) polyimide acid ester | 0 | 100 | 0 | 0 | 50 | 20 | 0 | 0 | 5 |
| Resin (M) polyamide acid ester | 100 | 0 | 0 | 100 | 70 | 0 | 0 | 0 | 5 |
| Resin (N) polyamide acid ester | 100 | 0 | 0 | 100 | 50 | 0 | 0 | 20 | 5 |
| Resin (O) polyamide acid ester | 100 | 0 | 0 | 100 | 0 | 20 | 0 | 50 | 5 |
| Resin (P) polyamide acid ester | 100 | 0 | 0 | 100 | 20 | 50 | 0 | 0 | 5 |
| Resin (Q) polyamide acid ester | 60 | 0 | 0 | 100 | 95 | 0 | 0 | 0 | 5 |
| Resin (R) polyimide | 100 | 0 | 0 | 100 | 80 | 0 | 0 | 0 | 5 |
| Resin (S) polyimide | 0 | 100 | 0 | 0 | 0 | 57 | 0 | 0 | 5 |
| Resin (T) polyamide acid ester | 30 | 70 | 0 | 30 | 40 | 45 | 0 | 0 | 5 |
| Resin (U) polyamide acid ester | 70 | 0 | 30 | 70 | 64 | 11 | 0 | 0 | 5 |

| | Composition of monomer and end capping agent | | | | | | |
|---|---|---|---|---|---|---|---|
| | Formula (3) in $R^2$ | Formula (4) in $R^2$ | End capping agent (molar ratio) | | | Monoamine | Acid anhydride |
| Resin | mol % | mol % | MAP | ABP | MA | mol % | mol % |
| Resin (A) polyamide acid ester | 67 | 27 | 50 | 0 | 0 | 50 | 0 |
| Resin (B) polyamide acid ester | 67 | 27 | 50 | 0 | 0 | 50 | 0 |
| Resin (C) polyamide acid ester | 80 | 14 | 40 | 0 | 0 | 40 | 0 |
| Resin (D) polyamide acid ester | 50 | 42 | 0 | 80 | 0 | 80 | 0 |
| Resin (E) polyamide acid ester | 70 | 25 | 0 | 0 | 80 | 0 | 80 |
| Resin (F) polyamide acid ester | 85 | 10 | 0 | 0 | 50 | 0 | 50 |
| Resin (G) polyamide acid ester | 50 | 45 | 0 | 0 | 100 | 0 | 100 |

TABLE 1-continued

| Resin | | | | | | | | |
|---|---|---|---|---|---|---|---|---|
| Resin (H) polyamide acid ester | 75 | 19 | 30 | 0 | 0 | 30 | 0 |
| Resin (I) polyamide acid ester | 55 | 36 | 0 | 90 | 0 | 90 | 0 |
| Resin (J) polyamide acid ester | 85 | 10 | 0 | 0 | 40 | 0 | 40 |
| Resin (K) polyamide acid ester | 50 | 45 | 0 | 0 | 110 | 0 | 110 |
| Resin (L) polyimide acid ester | 67 | 27 | 50 | 0 | 0 | 50 | 0 |
| Resin (M) polyamide acid ester | 93 | 0 | 50 | 0 | 0 | 50 | 0 |
| Resin (N) polyamide acid ester | 67 | 0 | 50 | 0 | 0 | 50 | 0 |
| Resin (O) polyamide acid ester | 0 | 27 | 50 | 0 | 0 | 50 | 0 |
| Resin (P) polyamide acid ester | 27 | 67 | 50 | 0 | 0 | 50 | 0 |
| Resin (Q) polyamide acid ester | 95 | 0 | 0 | 0 | 80 | 0 | 80 |
| Resin (R) polyimide | 94 | 0 | 20 | 0 | 0 | 20 | 0 |
| Resin (S) polyimide | 0 | 92 | 75 | 0 | 0 | 75 | 0 |
| Resin (T) polyamide acid ester | 44 | 50 | 0 | 0 | 0 | 0 | 0 |
| Resin (U) polyamide acid ester | 80 | 14 | 0 | 0 | 0 | 0 | 0 |

TABLE 2

| | | Solubility evaluation 30 wt % PGMEA solution | | |
|---|---|---|---|---|
| Resin | | Solubility | Polymer solution viscosity | Assessment |
| Resin (A) | Polyamide acid ester | Soluble | 119 mPa·s | A |
| Resin (B) | Polyamide acid ester | Soluble | 142 mPa·s | A |
| Resin (C) | Polyamide acid ester | Soluble | 135 mPa·s | A |
| Resin (D) | Polyamide acid ester | Soluble | 110 mPa·s | A |
| Resin (E) | Polyamide acid ester | Soluble | 110 mPa·s | A |
| Resin (F) | Polyamide acid ester | Soluble | 145 mPa·s | A |
| Resin (G) | Polyamide acid ester | Soluble | 98 mPa·s | A |
| Resin (H) | Polyamide acid ester | Soluble | 171 mPa·s | B |
| Resin (I) | Polyamide acid ester | Soluble | 86 mPa·s | A |
| Resin (J) | Polyamide acid ester | Soluble | 165 mPa·s | B |
| Resin (K) | Polyamide acid ester | Soluble | 87 mPa·s | A |
| Resin (L) | Polyamide acid ester | Insoluble | — | C |
| Resin (M) | Polyamide acid ester | Insoluble | — | C |
| Resin (N) | Polyamide acid ester | Insoluble | — | C |
| Resin (O) | Polyamide acid ester | Insoluble | — | C |
| Resin (P) | Polyamide acid ester | Soluble | 109 mPa·s | A |
| Resin (Q) | Polyamide acid ester | Insoluble | — | C |
| Resin (R) | Polyimide | Soluble | 257 mPa·s | B |
| Resin (S) | Polyimide | Soluble | 173 mPa·s | B |
| Resin (T) | Polyamide acid ester | Insoluble | — | C |
| Resin (U) | Polyamide acid ester | Insoluble | — | C |

TABLE 3

| | Varnish composition | | | | Development film loss | |
|---|---|---|---|---|---|---|
| Varnish | Resin | Photosensitive Agent | Solvent | Others | amount (μm) | Assessment |
| Example 1 | A-1 | A | b-1 | GBL | e-1 | 0.41 | A |
| Example 2 | B | B | b-1 | GBL | d-1 e-1 | 0.37 | A |
| Example 3 | C | C | b-1 | GBL | d-2 e-1 | 0.35 | A |
| Example 4 | D | D | b-1 | GBL | d-3 e-1 | 0.45 | A |
| Example 5 | E | E | b-1 | GBL | d-1 e-1 | 0.48 | A |

TABLE 3-continued

| | Varnish | Resin | Varnish composition Photosensitive Agent | Solvent | Others | Development film loss amount (μm) | Assessment |
|---|---|---|---|---|---|---|---|
| Example 6 | F | F | b-1 | GBL | d-2 e-1 | 0.41 | A |
| Example 7 | G | G | b-1 | GBL | d-3 e-1 | 0.44 | A |
| Example 8 | A-2 | A | ODPTBO BPE-100, TPT | GBL | d-3 | 0.21 | A |
| Example 9 | H | H | b-1 | GBL | d-2 e-1 | 0.29 | A |
| Example 10 | I | I | b-1 | GBL | d-3 e-1 | 0.59 | B |
| Example 11 | J | J | b-1 | GBL | d-2 e-1 | 0.32 | A |
| Example 12 | K | K | b-1 | GBL | d-3 e-1 | 0.58 | B |
| Comparative example 1 | L | L | b-1 | GBL | e-1 | 0.63 | C |
| Comparative example 2 | M | M | b-1 | GBL | e-1 | 0.41 | A |
| Comparative example 3 | N | N | b-1 | GBL | e-1 | 0.28 | A |
| Comparative example 4 | O | O | b-1 | GBL | e-1 | 0.87 | C |
| Comparative example 5 | P | P | b-1 | GBL | e-1 | 0.65 | C |
| Comparative example 6 | Q | Q | b-1 | GBL | e-1 | 0.39 | A |
| Comparative example 7 | R | R | b-1 | GBL | e-1 | 0.71 | C |
| Comparative example 8 | S | S | b-1 | GBL | e-1 | 0.93 | C |
| Comparative example 9 | T | T | b-1 | GBL | e-1 | 0.47 | A |
| Comparative example 10 | U | U | b-1 | GBL | e-1 | 0.42 | A |

Example 13

In a dry nitrogen flow, 16.6 g (0.0275 mole) of the diamine compound (α) prepared in Synthesis example 1, 1.83 g (0.005 mole) of BAHF and 0.62 g (0.0025 mole) of SiDA (manufactured by Shin-Etsu Chemical Co., Ltd.) were dissolved in 200 g of NMP. Then, 22.2 g (0.05 mole) of 6FDA (manufactured by DAIKIN INDUSTRIES, Ltd.) was added along with 50 g of NMP, and the mixture was stirred at 40° C. for 1 hour. Subsequently, 3.27 g (0.03 mole) of MAP (manufactured by Tokyo Chemical Industry Co., Ltd.) was added, and the mixture was stirred at 40° C. for 1 hour. Further, a solution prepared by diluting 11.9 g (0.1 mole) of DFA (manufactured by Mitsubishi Rayon Co., Ltd.) with 5 g of NMP was added dropwise over 10 minutes, and after the dropwise addition, stirring was continued at 40° C. for 2 hours. After the end of stirring, the solution was put in 2 L of water, and the polymer solid precipitate was collected by filtration. Further, the precipitate was washed with 2 L of water three times, and the collected polymer solid material was dried in a vacuum dryer at 50° C. for 72 hours to provide a polyamide acid ester resin (AA). Using the obtained resin (AA), evaluation of solubility in an organic solvent was performed by the above-described methods.

To 7.0 g of the obtained resin (AA) were added 2.0 g of the quinone diazide compound (b-1) prepared in Synthesis example 2, 2.0 g of the phenol compound (e-1), 0.01 g of Megafac F554 (manufactured by DIC Corporation) and 44 g of PGMEA to provide a varnish (AA-1) of a positive photosensitive resin composition with a solid content of 20%. Using the varnish (AA-1), viscosity evaluation and photosensitivity evaluation were performed as described above. The results are shown in Table 5.

Example 14

In a dry nitrogen flow, 22.2 g (0.05 mole) of 6FDA was dissolved in 200 g of NMP. Then, 4.95 g (0.03 mole) of ABP (manufactured by Tokyo Chemical Industry Co., Ltd.) was added, and the mixture was stirred at 40° C. for 1 hour. Subsequently, 16.6 g (0.0275 mole) of the diamine compound (α), 1.83 g (0.005 mole) of BAHF and 0.62 g (0.0025 mole) of SiDA were added along with 50 g of NMP, and the mixture was stirred at 40° C. for 2 hours. Further, a solution prepared by diluting 11.9 g (0.1 mole) of DFA with 5 g of NMP was added dropwise over 10 minutes, and after the dropwise addition, stirring was continued at 40° C. for 2 hours. After the end of stirring, the solution was put in 2 L of water, and the polymer solid precipitate was collected by filtration. Further, the precipitate was washed with 2 L of water three times, and the collected polymer solid material was dried in a vacuum dryer at 50° C. for 72 hours to provide a polyamide acid ester resin (AB). Using the obtained resin (AB), evaluation of solubility in an organic solvent was performed in the same manner as in Example 13.

Except that 7.0 g of the resin (AB) prepared in the above procedure was added in place of the resin (AA), the same procedure as in Example 13 was carried out to prepare a varnish (AB) of a positive photosensitive resin composition. Using the obtained varnish (AB), viscosity evaluation and photosensitivity evaluation were performed in the same manner as in Example 13. The results are shown in Table 5.

Example 15

Except that the amount of BAHF was changed from 1.83 g (0.005 mole) to 0.91 g (0.0025 mole), and the amount of MAP was changed from 3.27 g (0.03 mole) to 3.81 g (0.035 mole), the same procedure as in Example 13 was carried out to provide a polyamide acid ester resin (AC). Using the obtained resin (AC), evaluation of solubility in an organic solvent was performed in the same manner as in Example 13.

Except that 7.0 g of the resin (AC) prepared in the above procedure was added in place of the resin (AA), the same procedure as in Example 1 was carried out to prepare a varnish (AC) of a positive photosensitive resin composition with a solid content of 20%. Using the obtained varnish (AC), viscosity evaluation and photosensitivity evaluation were performed in the same manner as in Example 13. The results are shown in Table 5.

Example 16

Except that the amount of ABP was changed from 4.95 g (0.03 mole) to 5.73 g (0.035 mole), and the amount of BAHF was changed from 1.83 g (0.005 mole) to 0.915 g (0.0025 mole), the same procedure as in Example 14 was carried out to provide a polyamide acid ester resin (AD). Using the obtained resin (AD), evaluation of solubility in an organic solvent was performed in the same manner as in Example 13.

Except that 10 g of the resin (AD) prepared in the above procedure was added in place of the resin (AA), and further, 0.5 g of the thermal crosslinking agent (d-3), was added, the same procedure as in Example 13 was carried out to prepare a varnish (AD) of a positive photosensitive resin composition. Using the obtained varnish (AD), viscosity evaluation and photosensitivity evaluation were performed in the same manner as in Example 13. The results are shown in Table 5.

Example 17

In a dry nitrogen flow, 25.7 g (0.0425 mole) of the diamine compound (α), 1.83 g (0.005 mole) of BAHF and 0.62 g (0.0025 mole) of SiDA were dissolved in 200 g of NMP. Then, 17.8 g (0.04 mole) of 6FDA was added along with 50 g of NMP, and the mixture was stirred at 40° C. for 1 hour. Subsequently, 1.96 g (0.02 mole) of MA (manufactured by Wako Pure Chemical Industries, Ltd.) was added, and the mixture was stirred at 40° C. for 1 hour. Further, a solution prepared by diluting 11.9 g (0.1 mole) of DFA with 5 g of NMP was added dropwise over 10 minutes, and after the dropwise addition, stirring was continued at 40° C. for 2 hours. After the end of stirring, the solution was put in 2 L of water, and the polymer solid precipitate was collected by filtration. Further, the precipitate was washed with 2 L of water three times, and the collected polymer solid material was dried in a vacuum dryer at 50° C. for 72 hours to provide a polyamide acid ester resin (AE). Using the obtained resin (AE), evaluation of solubility in an organic solvent was performed in the same manner as in Example 13.

Except that 7.0 g of the resin (AE) prepared in the above procedure was added in place of the resin (AA), the same procedure as in Example 13 was carried out to prepare a varnish (AE) of a positive photosensitive resin composition. Using the obtained varnish (AE), viscosity evaluation and photosensitivity evaluation were performed in the same manner as in Example 13. The results are shown in Table 5.

Example 18

Except that the amount of ABP was changed from 4.95 g (0.03 mole) to 2.48 g (0.015 mole), the amount of the diamine compound (α) was changed from 16.6 g (0.0275 mole) to 18.1 g (0.03 mole), and the amount of BAHF was changed from 1.83 g (0.005 mole) to 3.66 g (0.01 mole), the same procedure as in Example 14 was carried out to provide a polyamide acid ester resin (AF). Using the obtained resin (AF), evaluation of solubility in an organic solvent was performed in the same manner as in Example 13.

Except that 7.0 g of the resin (AF) prepared in the above procedure was added in place of the resin (AA), the same procedure as in Example 13 was carried out to prepare a varnish (AF) of a positive photosensitive resin composition with a solid content of 20%. Using the obtained varnish (AF), viscosity evaluation and photosensitivity evaluation were performed in the same manner as in Example 13. The results are shown in Table 5.

Example 19

Except that the amount of the diamine compound (α) was changed from 16.6 g (0.0275 mole) to 13.6 g (0.0225 mole), the amount of BAHF was changed from 1.83 g (0.005 mole) to 7.32 g (0.02 mole), and the amount of MAP was changed from 3.27 g (0.03 mole) to 1.09 g (0.01 mole), the same procedure as in Example 13 was carried out to provide a polyamide acid ester resin (AG). Using the obtained resin (AG), evaluation of solubility in an organic solvent was performed in the same manner as in Example 13.

Except that 7.0 g of the resin (AG) prepared in the above procedure was added in place of the resin (AA), the same procedure as in Example 13 was carried out to prepare a varnish (AG) of a positive photosensitive resin composition with a solid content of 20%. Using the obtained varnish (AG), viscosity evaluation and photosensitivity evaluation were performed in the same manner as in Example 13. The results are shown in Table 5.

Example 20

Except that the amount of ABP was changed from 4.95 g (0.03 mole) to 4.13 g (0.025 mole), the amount of the diamine compound (α) was changed from 16.6 g (0.0275 mole) to 3.02 g (0.005 mole), and the amount of BAHF was changed from 1.83 g (0.005 mole) to 10.98 g (0.03 mole), the same procedure as in Example 14 was carried out to provide a polyamide acid ester resin (AH). Using the obtained resin (AH), evaluation of solubility in an organic solvent was performed in the same manner as in Example 13.

Except that 7.0 g of the resin (AH) prepared in the above procedure was added in place of the resin (AA), the same procedure as in Example 1 was carried out to prepare a varnish (AH) of a positive photosensitive resin composition with a solid content of 20%. Using the obtained varnish (AH), viscosity evaluation and photosensitivity evaluation were performed in the same manner as in Example 13. The results are shown in Table 5.

Example 21

Except that the amount of the diamine compound (α) was changed from 16.6 g (0.0275 mole) to 3.02 g (0.005 mole), the amount of BAHF was changed from 1.83 g (0.005 mole) to 12.81 g (0.035 mole), and the amount of MAP was changed from 3.27 g (0.03 mole) to 1.64 g (0.015 mole), the same procedure as in Example 13 was carried out to provide a polyamide acid ester resin (AI). Using the obtained resin (AI), evaluation of solubility in an organic solvent was performed in the same manner as in Example 13.

Except that 7.0 g of the resin (AI) prepared in the above procedure was added in place of the resin (A), the same procedure as in Example 13 was carried out to prepare a varnish (AI) of a positive photosensitive resin composition with a solid content of 20%. Using the obtained varnish (AI), viscosity evaluation and photosensitivity evaluation were performed in the same manner as in Example 13. The results are shown in Table 5.

Example 22

Except that 3.62 g (0.01 mole) of BIS-AT-AF (manufactured by Central Glass Co., Ltd.) was added in place of 1.83 g (0.005 mole) of BAHF, the amount of the diamine compound (α) was changed from 16.6 g (0.0275 mole) to 15.1 g (0.025 mole), and the amount of MAP was changed from 3.27 g (0.03 mole) to 2.73 g (0.025 mole), the same procedure as in Example 13 was carried out to provide a polyamide acid ester resin (AJ). Using the obtained resin (AJ), evaluation of solubility in an organic solvent was performed in the same manner as in Example 13.

Except that 7.0 g of the resin (AJ) prepared in the above procedure was added in place of the resin (AA), the same procedure as in Example 13 was carried out to prepare a varnish (AJ) of a positive photosensitive resin composition with a solid content of 20%. Using the obtained varnish (AJ), viscosity evaluation and photosensitivity evaluation were performed in the same manner as in Example 13. The results are shown in Table 5.

Example 23

Except that the amount of ABP was changed from 4.95 g (0.03 mole) to 6.60 g (0.04 mole), 4.53 g (0.0125 mole) of BIS-AT-AF was added in place of 1.83 g (0.005 mole) of BAHF, and the amount of the diamine compound (α) was changed from 16.6 g (0.0275 mole) to 9.06 g (0.015 mole), the same procedure as in Example 14 was carried out to provide a polyamide acid ester resin (AK). Using the obtained resin (AK), evaluation of solubility in an organic solvent was performed in the same manner as in Example 13.

Except that 7.0 g of the resin (AK) prepared in the above procedure was added in place of the resin (AA), the same procedure as in Example 13 was carried out to prepare a varnish (AK) of a positive photosensitive resin composition with a solid content of 20%. Using the obtained varnish (AK), viscosity evaluation and photosensitivity evaluation were performed in the same manner as in Example 13. The results are shown in Table 5.

Example 24

Except that the amount of the diamine compound (α) was changed from 25.7 g (0.0425 mole) to 21.1 g (0.035 mole), the amount of BAHF was changed from 1.83 g (0.005 mole) to 4.57 g (0.0125 mole), the amount of 6FDA was changed from 17.8 g (0.04 mole) to 13.3 g (0.03 mole), and the amount of MA was changed from 1.96 g (0.02 mole) to 3.92 g (0.04 mole), the same procedure as in Example 17 was carried out to provide a polyamide acid ester resin (AL). Using the obtained resin (AL), evaluation of solubility in an organic solvent was performed in the same manner as in Example 13.

Except that 7.0 g of the resin (AL) prepared in the above procedure was added in place of the resin (AA), the same procedure as in Example 13 was carried out to prepare a varnish (AL) of a positive photosensitive resin composition with a solid content of 20%. Using the obtained varnish (AL), viscosity evaluation and photosensitivity evaluation were performed in the same manner as in Example 13. The results are shown in Table 5.

Example 25

Except that the amount of 6FDA was changed from 17.8 g (0.04 mole) to 16.6 g (0.0375 mole), and the amount of MA was changed from 1.96 g (0.02 mole) to 2.45 g (0.025 mole), the same procedure as in Example 17 was carried out to provide a polyamide acid ester resin (AM). Using the obtained resin (AM), evaluation of solubility in an organic solvent was performed in the same manner as in Example 13.

Except that 7.0 g of the resin (AM) prepared in the above procedure was added in place of the resin (AA), the same procedure as in Example 13 was carried out to prepare a varnish (AM) of a positive photosensitive resin composition with a solid content of 20%. Using the obtained varnish (AM), viscosity evaluation and photosensitivity evaluation were performed in the same manner as in Example 13. The results are shown in Table 5.

Example 26

Except that the amount of the diamine compound (α) was changed from 25.7 g (0.0425 mole) to 15.1 g (0.025 mole), the amount of BAHF was changed from 1.83 g (0.005 mole) to 8.23 g (0.0225 mole), the amount of 6FDA was changed from 17.8 g (0.04 mole) to 11.1 g (0.025 mole), and the amount of MA was changed from 1.96 g (0.02 mole) to 4.90 g (0.05 mole), the same procedure as in Example 17 was carried out to provide a polyimide acid ester resin (AN). Using the obtained resin (AN), evaluation of solubility in an organic solvent was performed in the same manner as in Example 13.

Except that 7.0 g of the resin (AN) prepared in the above procedure was added in place of the resin (AA), the same procedure as in Example 13 was carried out to prepare a varnish (AN) of a positive photosensitive resin composition with a solid content of 20%. Using the obtained varnish (AN), viscosity evaluation and photosensitivity evaluation were performed in the same manner as in Example 13. The results are shown in Table 5.

Example 27

Except that the amount of the diamine compound (α) was changed from 16.6 g (0.0275 mole) to 7.56 g (0.0125 mole), the amount of BAHF was changed from 1.83 g (0.005 mole) to 8.24 g (0.0225 mole), and the amount of MAP was changed from 3.27 g (0.03 mole) to 2.73 g (0.025 mole), the same procedure as in Example 13 was carried out to provide a polyamide acid ester resin (AO). Using the obtained resin (AO), evaluation of solubility in an organic solvent was performed in the same manner as in Example 13.

Except that 7.0 g of the resin (AO) prepared in the above procedure was added in place of the resin (AA), the same procedure as in Example 13 was carried out to prepare a varnish (AO) of a positive photosensitive resin composition with a solid content of 20%. Using the obtained varnish (AO), viscosity evaluation and photosensitivity evaluation were performed in the same manner as in Example 13. The results are shown in Table 5.

Example 28

In a dry nitrogen flow, 7.32 g (0.02 mole) of BAHF, 7.24 g (0.02 mole) of BIS-AT-AF and 2.18 g (0.02 mole) of MAP were dissolved in 50 g of NMP and 26.4 g (0.3 mole) of glycidyl methyl ether, and the solution was cooled to −15° C. Then, a solution prepared by dissolving 14.7 g (0.050 mole) of diphenyl ether dicarboxylic acid chloride (manufactured by Nihon Nohyaku Co., Ltd.) in 25 g of GBL was added dropwise while the internal temperature was kept at 0° C. or lower. After the end of dropwise addition, stirring was continued at −15° C. for 6 hours. After the end of the reaction, the solution was put in 3 L of water containing 10% by weight of methanol, and a white solid was precipitated. The precipitate was collected by filtration, and washed with water three times, and then dried in a vacuum dryer at 50° C. for 72 hours to provide an alkali-soluble polybenzoxazole precursor (AP). Using the obtained resin (AP), evaluation of solubility in an organic solvent was performed in the same manner as in Example 13.

Except that 7.0 g of the resin (AP) prepared in the above procedure was added in place of the resin (AA), the same procedure as in Example 13 was carried out to prepare a varnish (AP) of a positive photosensitive resin composition with a solid content of 20%. Using the obtained varnish (AP), viscosity evaluation and photosensitivity evaluation were performed in the same manner as in Example 13. The results are shown in Table 5.

Example 29

To 7.0 g of the resin (AA) prepared in Example 13 were added 2.0 g of the quinone diazide compound (b-1), 2.0 g of the phenol compound (e-1), 2.0 g of the alkoxymethyl group-containing thermal crosslinking agent (d-1) prepared in Synthesis example 3, 0.01 g of Megafac F554 (manufactured by DIC Corporation) and 52 g of PGMEA to provide a varnish (AA-2) of a positive photosensitive resin composition with a solid content of 20%. Using the varnish (AA-2), viscosity evaluation and photosensitivity evaluation were performed as described above. The results are shown in Table 5.

Example 30

To 7.0 g of the resin (AA) prepared in Example 13 were added 2.0 g of the quinone diazide compound (b-1), 2.0 g of the phenol compound (e-1), 2.0 g of the alkoxymethyl group-containing thermal crosslinking agent (d-2), 0.01 g of Megafac F554 (manufactured by DIC Corporation) and 52 g of PGMEA to provide a varnish (AA-3) of a positive photosensitive resin composition with a solid content of 20%. Using the varnish (AA-3), viscosity evaluation and photosensitivity evaluation were performed as described above. The results are shown in Table 5.

Example 31

To 7.0 g of the resin (AA) prepared in Example 13 were added 2.0 g of the quinone diazide compound (b-1), 2.0 g of the phenol compound (e-1), 2.0 g of the thermal crosslinking agent (d-3), 0.01 g of Megafac F554 (manufactured by DIC Corporation) and 52 g of PGMEA to provide a varnish (AA-4) of a positive photosensitive resin composition with a solid content of 20%. Using the varnish (AA-4), viscosity evaluation and photosensitivity evaluation were performed as described above. The results are shown in Table 5.

Example 32

To 10 g of the resin (AA) prepared in Example 13 were added 0.1 g of 1,2-octanedione-1-[4-(phenyl thio)-2-(o-benzoyloxime)] (ODPTBO) (manufactured by BASF Japan Ltd.), 2.0 g of ethylene oxide-modified bisphenol A dimethacrylate (NK Ester BPE-100 manufactured by Shin-Nakamura Chemical Co., Ltd.), 0.5 g of trimethylolpropane triacrylate (TPT), 1.0 g of the thermal crosslinking agent (d-3), 0.01 g of Megafac F554 (manufactured by DIC Corporation) and 54.4 g of PGMEA were added to provide a varnish (A-5) of a negative photosensitive resin composition. Using the obtained varnish (AA-5), viscosity evaluation and photosensitivity evaluation were performed as described above. The results are shown in Table 5.

Comparative Example 11

In a dry nitrogen flow, 18.3 g (0.05 mole) of BAHF was dissolved in 50 g of NMP and 26.4 g (0.3 mole) of glycidyl methyl ether, and the solution was cooled to −15° C. Then, a solution prepared by dissolving 14.7 g (0.050 mole) of diphenyl ether dicarboxylic acid chloride (manufactured by Nihon Nohyaku Co., Ltd.) in 25 g of GBL was added dropwise while the internal temperature was kept at 0° C. or lower. After the end of dropwise addition, stirring was continued at −15° C. for 6 hours. After the end of the reaction, the solution was put in 3 L of water containing 10% by weight of methanol, and a white solid was precipitated. The precipitate was collected by filtration, and washed with water three times, and then dried in a vacuum dryer at 50° C. for 72 hours to provide an alkali-soluble polybenzoxazole precursor (AQ). Using the obtained resin (AQ), evaluation of solubility in an organic solvent was performed in the same manner as in Example 13.

Except that 7.0 g of the resin (AQ) prepared in the above procedure was added in place of the resin (AA), the same procedure as in Example 13 was carried out to prepare a varnish (Q) of a positive photosensitive resin composition with a solid content of 20%. Using the obtained varnish (AQ), viscosity evaluation and photosensitivity evaluation were performed in the same manner as in Example 13. The results are shown in Table 5.

Comparative Example 12

Except that 15.5 g (0.05 mole) of ODPA was added in place of 22.2 g (0.05 mole) of 6FDA, the amount of the diamine compound (α) was changed from 16.6 g (0.0275 mole) to 24.18 g (0.04 mole), the amount of MAP was changed from 3.27 g (0.03 mole) to 1.09 g (0.01 mole), and BAHF was not added, the same procedure as in Example 13 was carried out to provide a polyamide acid ester resin (AR). Using the obtained resin (AR), evaluation of solubility in an organic solvent was performed in the same manner as in Example 13.

Comparative Example 13

In a dry nitrogen flow, 15.46 g (0.04225 mole) of BAHF and 0.62 g (0.0025 mole) of SiDA were dissolved in 250 g of NMP. Then, 15.5 g (0.05 mole) of ODPA was added along with 50 g of NMP, and the mixture was stirred at 30° C. for 2 hours. Subsequently, 1.09 g (0.01 mole) of MAP (manufactured by Tokyo Chemical Industry Co., Ltd.) was added, and stirring was continued at 40° C. for 2 hours. Further, 2.5 g of pyridine (manufactured by Tokyo Chemical Industry Co., Ltd.) was diluted with 15 g of toluene (manufactured by Tokyo Chemical Industry Co., Ltd.) and added to the solution, which was then heated for reaction at 120° C. for 2 hours and subsequently at 180° C. for 2 hours, with a cooling pipe provided to remove water out of the reaction system by azeotropy with toluene. The solution was cooled down to room temperature and poured in 2 L of water, and the polymer solid precipitate was collected by filtration. Further, the precipitate was washed with 2 L of water three times, and the collected polymer solid material was dried in a vacuum dryer at 50° C. for 72 hours to provide a polyimide resin (AS). Using the obtained resin (AS), evaluation of solubility in an organic solvent was performed in the same manner as in Example 13.

Except that 7.0 g of the resin (AS) prepared in the above procedure was added in place of the resin (AA), the same procedure as in Example 13 was carried out to prepare a varnish (AS) of a positive photosensitive resin composition with a solid content of 20%. Using the obtained varnish (AS), viscosity evaluation and photosensitivity evaluation were performed in the same manner as in Example 13. The results are shown in Table 5.

Comparative Example 14

Except that 15.5 g (0.05 mole) of ODPA was added in place of 22.2 g (0.05 mole) of 6FDA, the amount of the diamine compound (α) was changed from 16.6 g (0.0275 mole) to 15.1 g (0.025 mole), the amount of BAHF was changed from 1.83 g (0.005 mole) to 3.66 g (0.01 mole), and the amount of MAP was changed from 3.27 g (0.03 mole) to 2.73 g (0.025 mole), the same procedure as in Example 13 was carried out to provide a polyamide acid ester resin (AT). Using the obtained resin (AT), evaluation of solubility in an organic solvent was performed in the same manner as in Example 13.

Comparative Example 15

Except that the amount of the diamine compound (α) was changed from 16.6 g (0.0275 mole) to 21.1 g (0.035 mole), the amount of MAP was changed from 3.27 g (0.03 mole) to 2.73 g (0.025 mole), and BAHF was not added, the same procedure as in Example 13 was carried out to provide a polyamide acid ester resin (AU). Using the obtained resin (AU), evaluation of solubility in an organic solvent was performed in the same manner as in Example 13.

Comparative Example 16

Except that the amount of the diamine compound (α) was changed from 16.6 g (0.0275 mole) to 15.1 g (0.0225 mole), 2.48 g (0.01 mole) of 3,3'-DDS (manufactured by MITSUI FINE CHEMICALS, Inc.) was added in place of 1.83 g (0.005 mole) of BAHF, and the amount of MAP was changed from 3.27 g (0.03 mole) to 2.73 g (0.025 mole), the same procedure as in Example 13 was carried out to provide a polyamide acid ester resin (AV). Using the obtained resin (AV), evaluation of solubility in an organic solvent was performed in the same manner as in Example 13.

Comparative Example 17

Except that 6.20 g (0.025 mole) of 3,3'-DDS was added in place of 16.6 g (0.0275 mole) of the diamine compound (α), the amount of BAHF was changed from 1.83 g (0.005 mole) to 3.66 g (0.01 mole), and the amount of MAP was changed from 3.27 g (0.03 mole) to 2.73 g (0.025 mole), the same procedure as in Example 13 was carried out to provide a polyamide acid ester resin (AW). Using the obtained resin (AW), evaluation of solubility in an organic solvent was performed in the same manner as in Example 13.

Comparative Example 18

Except that the amount of the diamine compound (α) was changed from 25.7 g (0.0425 mole) to 28.7 g (0.0475 mole), the amount of 6FDA was changed from 17.8 g (0.04 mole) to 13.3 g (0.03 mole), the amount of MA was changed from 1.96 g (0.02 mole) to 3.92 g (0.04 mole), and BAHF was not added, the same procedure as in Example 17 was carried out to provide a polyamide acid ester resin (AX). Using the obtained resin (AX), evaluation of solubility in an organic solvent was performed in the same manner as in Example 13.

Comparative Example 19

In a dry nitrogen flow, 12.1 g (0.02 mole) of the diamine compound (α), 8.24 g (0.0225 mole) of BAHF and 0.62 g (0.0025 mole) of SiDA were dissolved in 200 g of NMP. Then, 6.66 g (0.015 mole) of 6FDA and 10.9 g (0.035 mole) of ODPA were added along with 50 g of NMP, and the mixture was stirred at 40° C. for 2 hours. Subsequently, a solution prepared by diluting 11.9 g (0.1 mole) of DFA with 5 g of NMP was added dropwise over 10 minutes, and after the dropwise addition, stirring was continued at 40° C. for 2 hours. After the end of stirring, the solution was put in 2 L of water, and the polymer solid precipitate was collected by filtration. Further, the precipitate was washed with 2 L of water three times, and the collected polymer solid material was dried in a vacuum dryer at 50° C. for 72 hours to provide a polyamide acid ester resin (AY). Using the obtained resin (AY), evaluation of solubility in an organic solvent was performed in the same manner as in Example 13.

Comparative Example 20

Except that the amount of the diamine compound (α) was changed from 12.1 g (0.02 mole) to 19.3 g (0.032 mole), the amount of BAHF was changed from 8.24 g (0.0225 mole) to 2.01 g (0.0055 mole), the amount of 6FDA was changed from 6.66 g (0.015 mole) to 15.5 g (0.035 mole), and 7.81 g (0.015 mole) of BSAA (manufactured by SABIC Japan Ltd.) was used in place of 10.9 g (0.035 mole) of ODPA, the same procedure as in Comparative example 19 was carried out to provide a polyamide acid ester resin (AZ). Using the obtained resin (AZ), evaluation of solubility in an organic solvent and measurement of a polymer solution viscosity were performed by the methods described above.

Compositions of monomers and end capping agents used for the resins AA to AZ used in Examples and Comparative examples are shown in Table 4, and results of evaluation of the solubility in an organic solvent, compositions of varnishes, varnish solution viscosities and the photosensitivity for the resins AA to AZ are shown in Table 5.

TABLE 4

| | Composition of monomer and end capping agent | | | | | | | | | |
|---|---|---|---|---|---|---|---|---|---|---|
| | Acid dianhydride (molar ratio) | | | Formula. (2) in R¹ mol % | Diphenyl ether dicarboxylic acid dichloride | Diamine (molar ratio) | | | | |
| Resin | 6FDA | ODPA | BSAA | | | α | BAHF | BIS-AT-AF | DDS | SiDA |
| Resin (AA) polyamide acid ester | 100 | 0 | 0 | 100 | — | 55 | 10 | 0 | 0 | 5 |
| Resin (AB) polyamide acid ester | 100 | 0 | 0 | 100 | — | 55 | 10 | 0 | 0 | 5 |
| Resin (AC) polyamide acid ester | 100 | 0 | 0 | 100 | — | 55 | 5 | 0 | 0 | 5 |
| Resin (AD) polyamide acid ester | 100 | 0 | 0 | 100 | — | 55 | 5 | 0 | 0 | 5 |
| Resin (AE) polyamide acid ester | 80 | 0 | 0 | 100 | — | 85 | 10 | 0 | 0 | 5 |
| Resin (AF) polyamide acid ester | 100 | 0 | 0 | 100 | — | 60 | 20 | 0 | 0 | 5 |
| Resin (AG) polyamide acid ester | 100 | 0 | 0 | 100 | — | 45 | 40 | 0 | 0 | 5 |
| Resin (AH) polyamide acid ester | 100 | 0 | 0 | 100 | — | 10 | 60 | 0 | 0 | 5 |
| Resin (AI) polyamide acid ester | 100 | 0 | 0 | 100 | — | 10 | 70 | 0 | 0 | 5 |
| Resin (AJ) polyamide acid ester | 100 | 0 | 0 | 100 | — | 50 | 0 | 20 | 0 | 5 |
| Resin (AK) polyamide acid ester | 100 | 0 | 0 | 100 | — | 30 | 0 | 25 | 0 | 5 |
| Resin (AL) polyamide acid ester | 60 | 0 | 0 | 100 | — | 70 | 25 | 0 | 0 | 5 |
| Resin (AM) polyamide acid ester | 75 | 0 | 0 | 100 | — | 85 | 10 | 0 | 0 | 5 |
| Resin (AN) polyamide acid ester | 50 | 0 | 0 | 100 | — | 50 | 45 | 0 | 0 | 5 |
| Resin (AO) polyamide acid ester | 100 | 0 | 0 | 100 | — | 25 | 45 | 0 | 0 | 5 |
| Resin (AP) PBO Precursor | 0 | 0 | 0 | 0 | 100 | 0 | 40 | 40 | 0 | 0 |
| Resin (AQ) PBO precursor | 0 | 0 | 0 | 0 | 100 | 0 | 100 | 0 | 0 | 0 |
| Resin (AR) polyamide acid ester | 0 | 100 | 0 | 0 | — | 80 | 0 | 0 | 0 | 5 |
| Resin (AS) polyimide | 0 | 100 | 0 | 0 | — | 0 | 84.5 | 0 | 0 | 5 |
| Resin (AT) polyamide acid ester | 0 | 100 | 0 | 0 | — | 50 | 20 | 0 | 0 | 5 |
| Resin (AU) polyamide acid ester | 100 | 0 | 0 | 100 | — | 70 | 0 | 0 | 0 | 5 |
| Resin (AV) polyamide acid ester | 100 | 0 | 0 | 100 | — | 50 | 0 | 0 | 20 | 5 |
| Resin (AW) polyamide acid ester | 100 | 0 | 0 | 100 | — | 0 | 20 | 0 | 50 | 5 |

TABLE 4-continued

| Resin | | | | | | | | | | |
|---|---|---|---|---|---|---|---|---|---|---|
| Resin (AX) polyamide acid ester | 60 | 0 | 0 | 100 | — | 95 | 0 | 0 | 0 | 5 |
| Resin (AY) polyamide acid ester | 30 | 70 | 0 | 30 | — | 40 | 45 | 0 | 0 | 5 |
| Resin (AZ) polyamide acid ester | 70 | 0 | 30 | 70 | — | 64 | 11 | 0 | 0 | 5 |

| | Composition of monomer and end capping agent | | | | | | |
|---|---|---|---|---|---|---|---|
| | Formula (3) in $R^2$ | Formula (4) in $R^2$ | End capping agent (molar ratio) | | | Monoamine | Acid anhydride |
| Resin | mol % | mol % | MAP | ABP | MA | mol % | mol % |
| Resin (AA) polyamide acid ester | 79 | 14 | 60 | 0 | 0 | 60 | 0 |
| Resin (AB) polyamide acid ester | 79 | 14 | 0 | 60 | 0 | 60 | 0 |
| Resin (AC) polyamide acid ester | 85 | 8 | 70 | 0 | 0 | 70 | 0 |
| Resin (AD) polyamide acid ester | 85 | 8 | 0 | 70 | 0 | 70 | 0 |
| Resin (AE) polyamide acid ester | 85 | 10 | 0 | 0 | 40 | 0 | 40 |
| Resin (AF) polyamide acid ester | 71 | 24 | 0 | 30 | 0 | 30 | 0 |
| Resin (AG) polyamide acid ester | 50 | 44 | 20 | 0 | 0 | 20 | 0 |
| Resin (AH) polyamide acid ester | 13 | 80 | 0 | 50 | 0 | 50 | 0 |
| Resin (AI) polyamide acid ester | 12 | 82 | 30 | 0 | 0 | 30 | 0 |
| Resin (AJ) polyamide acid ester | 67 | 27 | 50 | 0 | 0 | 50 | 0 |
| Resin (AK) polyamide acid ester | 50 | 42 | 0 | 80 | 0 | 80 | 0 |
| Resin (AL) polyamide acid ester | 70 | 25 | 0 | 0 | 80 | 0 | 80 |
| Resin (AM) polyamide acid ester | 85 | 10 | 0 | 0 | 50 | 0 | 50 |
| Resin (AN) polyamide acid ester | 50 | 45 | 0 | 0 | 100 | 0 | 100 |
| Resin (AO) polyamide acid ester | 33 | 60 | 50 | 0 | 0 | 50 | 0 |
| Resin (AP) PBO Precursor | 0 | 100 | 40 | 0 | 0 | 40 | 0 |
| Resin (AQ) PBO precursor | 0 | 100 | 0 | 0 | 0 | 0 | 0 |
| Resin (AR) polyamide acid ester | 94 | 0 | 20 | 0 | 0 | 20 | 0 |
| Resin (AS) polyimide | 0 | 94 | 20 | 0 | 0 | 20 | 0 |
| Resin (AT) polyamide acid ester | 67 | 27 | 50 | 0 | 0 | 50 | 0 |

TABLE 4-continued

| Resin | | | | | | | | |
|---|---|---|---|---|---|---|---|---|
| Resin (AU) polyamide acid ester | 93 | 0 | 50 | 0 | 0 | 50 | 0 |
| Resin (AV) polyamide acid ester | 67 | 0 | 50 | 0 | 0 | 50 | 0 |
| Resin (AW) polyamide acid ester | 0 | 27 | 50 | 0 | 0 | 50 | 0 |
| Resin (AX) polyamide acid ester | 95 | 0 | 0 | 0 | 80 | 0 | 80 |
| Resin (AY) polyamide acid ester | 44 | 50 | 0 | 0 | 0 | 0 | 0 |
| Resin (AZ) polyamide acid ester | 80 | 14 | 0 | 0 | 0 | 0 | 0 |

TABLE 5

| | Resin | Solubility evaluation | Varnish composition | | | | Viscosity evaluation | | Sensitivity evaluation Eop (mJ/cm²) |
|---|---|---|---|---|---|---|---|---|---|
| | | | Varnish | Photosensitive Agent | Solvent | Others | Varnish solution viscosity (cp) | Assessment | |
| Example 13 | AA | Soluble | AA-1 | b-1 | PGMEA | e-1 | 8.1 | S | 120 |
| Example 14 | AB | Soluble | AB | b-1 | PGMEA | e-1 | 7.9 | S | 120 |
| Example 15 | AC | Soluble | AC | b-1 | PGMEA | e-1 | 6.9 | S | 120 |
| Example 16 | AD | Soluble | AD | b-1 | PGMEA | e-1 | 6.7 | S | 120 |
| Example 17 | AE | Soluble | AE | b-1 | PGMEA | e-1 | 11.2 | A | 150 |
| Example 18 | AF | Soluble | AF | b-1 | PGMEA | e-1 | 12.6 | A | 150 |
| Example 19 | AG | Soluble | AG | b-1 | PGMEA | e-1 | 12.9 | A | 150 |
| Example 20 | AH | Soluble | AH | b-1 | PGMEA | e-1 | 7.5 | S | 190 |
| Example 21 | AI | Soluble | AI | b-1 | PGMEA | e-1 | 11.1 | A | 200 |
| Example 22 | AJ | Soluble | AJ | b-1 | PGMEA | e-1 | 8.8 | S | 140 |
| Example 23 | AK | Soluble | AK | b-1 | PGMEA | e-1 | 6.4 | S | 130 |
| Example 24 | AL | Soluble | AL | b-1 | PGMEA | e-1 | 7.5 | S | 140 |
| Example 25 | AM | Soluble | AM | b-1 | PGMEA | e-1 | 9.8 | S | 150 |
| Example 26 | AN | Soluble | AN | b-1 | PGMEA | e-1 | 6.1 | S | 150 |
| Example 27 | AO | Soluble | AO | b-1 | PGMEA | e-1 | 7.5 | S | 200 |
| Example 28 | AP | Soluble | AP | b-1 | PGMEA | e-1 | 9.5 | S | 200 |
| Example 29 | AA | Soluble | AA-2 | b-1 | PGMEA | e-1 d-1 | 6.7 | S | 130 |
| Example 30 | AA | Soluble | AA-3 | b-1 | PGMEA | e-1 d-2 | 6.7 | S | 130 |
| Example 31 | AA | Soluble | AA-4 | b-1 | PGMEA | e-1 d-3 | 6.2 | S | 130 |
| Example 32 | AA | Soluble | AA-5 | ODPTBO BPE-100 TPT | PGMEA | d-3 | 8.8 | S | 130 |
| Comparative example 11 | AQ | Soluble | AQ | b-1 | PGMEA | e-1 | 16.8 | C | 280 |
| Comparative example 12 | AR | Insoluble | — | — | — | — | — | — | — |
| Comparative example 13 | AS | Soluble | AS | b-1 | PGMEA | e-1 | 18.1 | C | 320 |
| Comparative example 14 | AT | Insoluble | — | — | — | — | — | — | — |
| Comparative example 15 | AU | Insoluble | — | — | — | — | — | — | — |
| Comparative example 16 | AV | Insoluble | — | — | — | — | — | — | — |
| Comparative example 17 | AW | Insoluble | — | — | — | — | — | — | — |
| Comparative example 18 | AX | Insoluble | — | — | — | — | — | — | — |
| Comparative example 19 | AY | Insoluble | — | — | — | — | — | — | — |
| Comparative example 20 | AZ | Insoluble | — | — | — | — | — | — | — |

Example 33

To 7.0 g of the resin (AA) prepared in Example 13 were added 2.0 g of the quinone diazide compound (b-1), 2.0 g of the phenol compound (e-1), 0.01 g of Megafac F554 (manufactured by DIC Corporation) and 99 g of GBL to provide a varnish (AA-6) of a positive photosensitive resin composition. A positive resist ("OFPR-800" manufactured by Tokyo Ohka Kogyo Co., Ltd.) was fed to a slit coater (TS Coater manufactured by Toray Engineering Co., Ltd.), the feed was then changed to the varnish (AA-6), and pressurized feeding was started to apply the photosensitive resin composition over a chromed substrate with a size of 1100 mm×960 mm in such a manner that the film thickness would be 5 μm after drying.

Example 34

A positive resist ("OFPR-800" manufactured by Tokyo Ohka Kogyo Co., Ltd.) was fed to a slit coater (TS Coater manufactured by Toray Engineering Co., Ltd.), and a liquid feeding pump, a liquid feeding line and a mouthpiece in the slit coater, extending from a liquid feeding tank to the tip of the mouthpiece, the volume of the pump, the line and the mouthpiece was 200 mL, were cleaned with 1 L of a thinner. The feed was then changed to the varnish (AA-6) used in Example 33, and pressurized feeding was started to apply the photosensitive resin composition over a chromed substrate with a size of 1100 mm×960 mm in such a manner that the film thickness would be 5 μm after drying.

Comparative Example 21

To 7.0 g of the resin (AR) prepared in Comparative example 12 were added 2.0 g of the quinone diazide compound (b-1), 2.0 g of the phenol compound (e-1), 0.01 g of Megafac F554 (manufactured by DIC Corporation) and 99 g of GBL to provide a varnish (AR) of a positive photosensitive resin composition. In the same manner as in Example 33, a positive resist ("OFPR-800") manufactured by Tokyo Ohka Kogyo Co., Ltd.) was fed to a slit coater (TS Coater manufactured by Toray Engineering Co., Ltd.), the feed was then changed to the varnish (AR), and pressurized feeding was started. Resultantly, it was confirmed that solid components were precipitated in the liquid feeding pump, the liquid feeding line and the mouthpiece.

Comparative Example 22

A positive resist ("OFPR-800" manufactured by Tokyo Ohka Kogyo Co., Ltd.) was fed to a slit coater (TS Coater manufactured by Toray Engineering Co., Ltd.), and a liquid feeding pump, a liquid feeding line and a mouthpiece in the slit coater, extending from a liquid feeding tank to the tip of the mouthpiece, the volume of the pump, the line and the mouthpiece was 200 mL, were cleaned with 1 L of a thinner. The feed was then changed to the varnish (AR) used in Comparative example 21, and pressurized feeding was started. Resultantly, it was confirmed that solid components were precipitated in the liquid feeding pump, the liquid feeding line and the mouthpiece.

INDUSTRIAL APPLICABILITY

The photosensitive resin composition of the present invention can be suitably used as surface protecting films and interlayer insulation films for semiconductor devices, insulation layers for organic EL devices, planarizing films of driving TFT substrates for display devices including an organic EL device.

The invention claimed is:

1. A photosensitive resin composition comprising: a resin (a) having as a main repeating unit a structure represented by the general formula (1); a photosensitive agent (b); and a solvent (c):

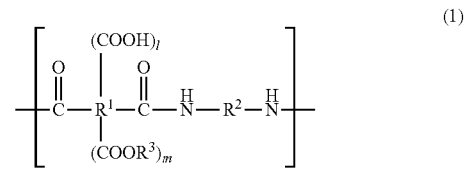

wherein different groups may exist as each of $R^1$ to $R^3$ in a plurality of repeating units;

$R^1$ is a tetravalent organic group, where 95 to 100 mol % of $R^1$ in all the repeating units is a group represented by the following formula (2);

$R^2$ is a divalent organic group, where 50 to 99 mol % of $R^2$ in all the repeating units is a group represented by the following formula (3), and 1 to 50 mol % of $R^2$ in all the repeating units is a group represented by the following formula (4);

$R^3$ represents an organic group with a carbon number of 1 to 20; and l and m each represent an integer of 0 to 2, where l+m=2; and

[Chemical compound 2]

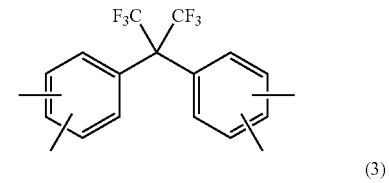

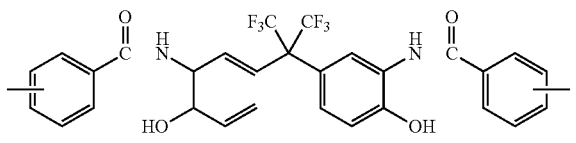

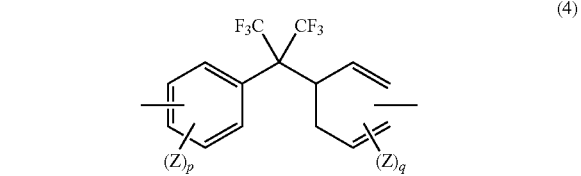

wherein, Z represents a hydroxyl group or a methyl group, and p and q each represent 0 or 1.

2. The photosensitive resin composition according to claim 1, wherein the resin (a) having as a main repeating unit a structure represented by the general formula (1) is end-capped with 10 to 100 mol % of a monoamine based on 100 mol % of a tetracarboxylic acid as a monomer component.

3. The photosensitive resin composition according to claim 1, wherein the resin (a) having as a main repeating unit a structure represented by the general formula (1) is end-capped with 10 to 100 mol % of an acid anhydride based on 100 mol % of a diamine as a monomer component.

4. The photosensitive resin composition according to claim 2, wherein the monoamine is a monoamine having a group represented by the general formula (5):

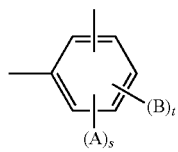

(5)

wherein, $R^5$ represents an unsaturated hydrocarbon group with a carbon number of 1 to 6, and r represents 0 or 1; A and B may be the same or different, and each represent a hydroxyl group, a carboxyl group or a sulfonic acid group; and s and t each represent 0 or 1, where $s+t \geq 1$.

5. The photosensitive resin composition according to claim 1, wherein the photosensitive agent (b) is a quinone diazide compound.

6. The photosensitive resin composition according to claim 2, wherein the photosensitive agent (b) is a quinone diazide compound.

7. The photosensitive resin composition according to claim 3, wherein the photosensitive agent (b) is a quinone diazide compound.

8. The photosensitive resin composition according to claim 4, wherein the photosensitive agent (b) is a quinone diazide compound.

9. A method for producing a heat-resistant resin film, the method comprising the steps of:
applying a photosensitive resin composition according to claim 1 to a substrate to form a photosensitive resin film;
drying the photosensitive resin film;
exposing the dried photosensitive resin film;
developing the exposed photosensitive resin film; and
subjecting the developed photosensitive resin film to a heating treatment.

10. A method for producing a heat-resistant resin film, the method comprising the steps of:
applying a photosensitive resin composition according to claim 2 to a substrate to form a photosensitive resin film;
drying the photosensitive resin film;
exposing the dried photosensitive resin film;
developing the exposed photosensitive resin film; and
subjecting the developed photosensitive resin film to a heating treatment.

11. A display device comprising: a first electrode formed on a substrate; an insulation layer formed on the first electrode so as to partially expose the first electrode; and a second electrode provided so as to face the first electrode, wherein the insulation layer is a heat-resistant resin film obtained by the method for producing a heat-resistant film according to claim 9.

12. A display device comprising: a planarizing film provided so as to cover irregularities on a substrate provided with a thin-film transistor (TFT); and a display element provided on the planarizing film, wherein the planarizing film is a heat-resistant resin film obtained by the method for producing a heat-resistant film according to claim 9.

* * * * *

UNITED STATES PATENT AND TRADEMARK OFFICE
CERTIFICATE OF CORRECTION

PATENT NO. : 9,897,915 B2  
APPLICATION NO. : 14/647747  
DATED : February 20, 2018  
INVENTOR(S) : Yusuke Komori et al.

Page 1 of 3

It is certified that error appears in the above-identified patent and that said Letters Patent is hereby corrected as shown below:

In the Specification

Column 6, Lines 46-54 [Chemical compound 8] should read:

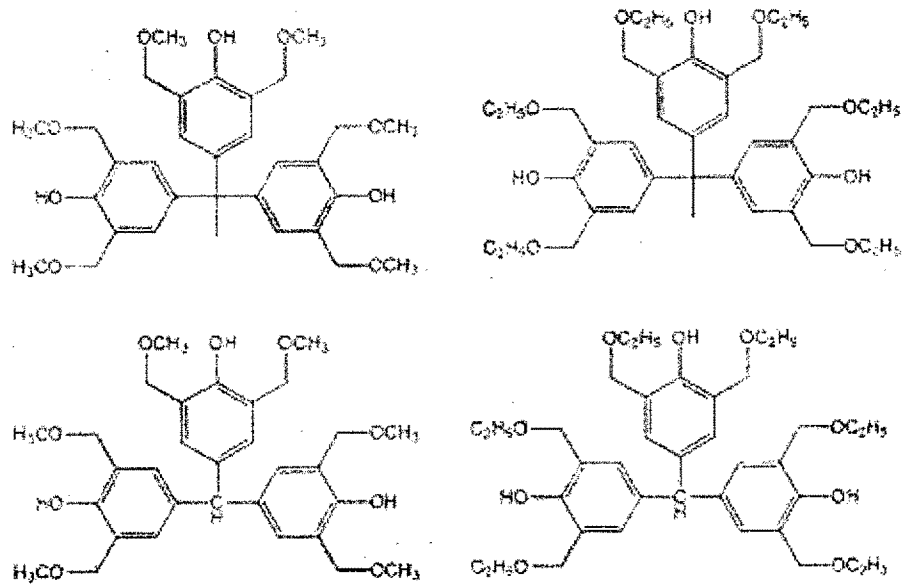

Signed and Sealed this  
Twenty-third Day of July, 2019

Andrei Iancu  
*Director of the United States Patent and Trademark Office*

CERTIFICATE OF CORRECTION (continued)
U.S. Pat. No. 9,897,915 B2

Column 29, Lines 5-10 [Chemical compound 15] should read:

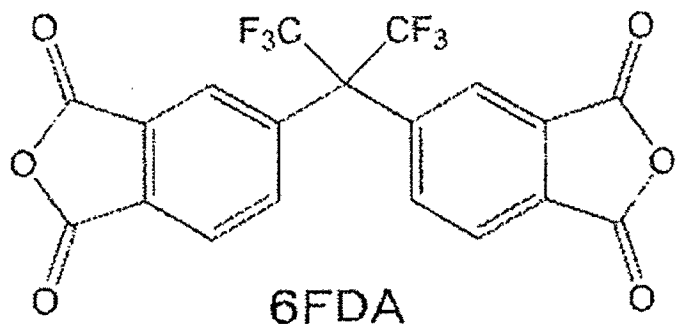

Column 31, Lines 2-24 [Chemical compound 17] should read:

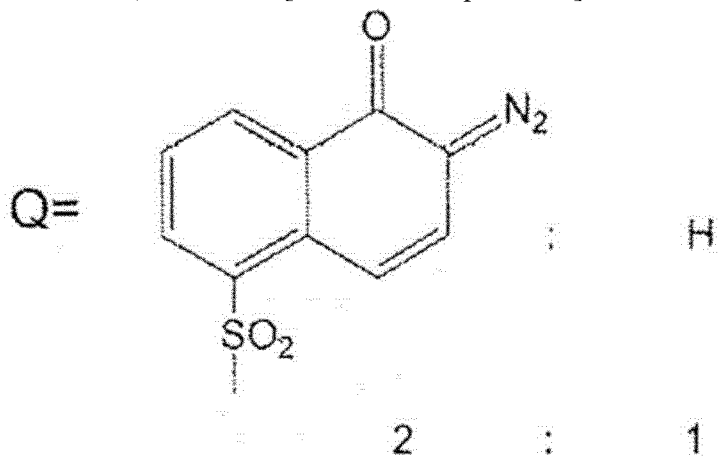

Column 32, Lines 37-60 [Chemical compound 19] should read:

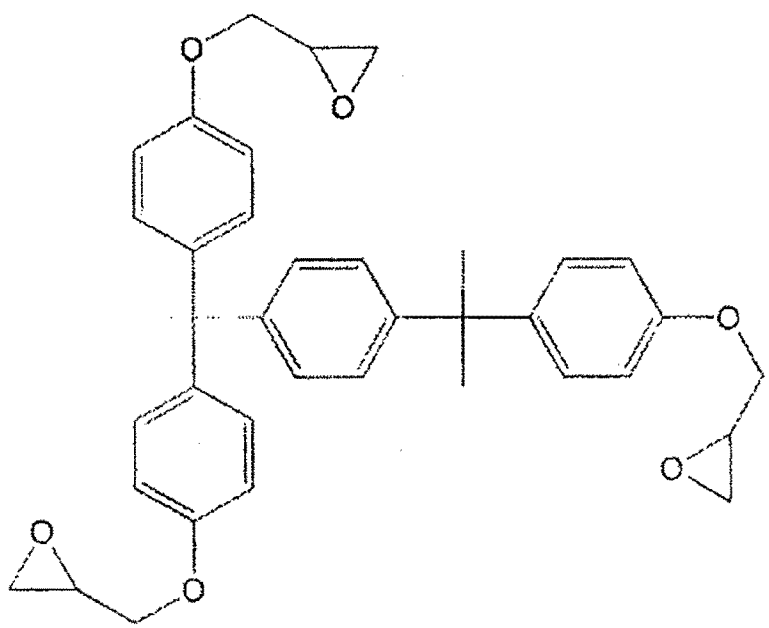

CERTIFICATE OF CORRECTION (continued)
U.S. Pat. No. 9,897,915 B2

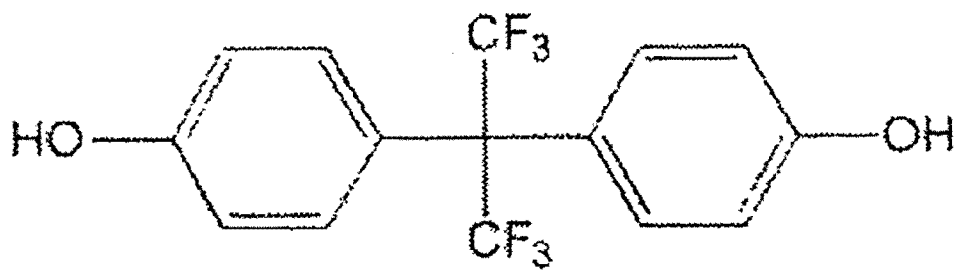

(e-1) BisP-AF

In the Claims

Column 62, Lines 27-50 should read:

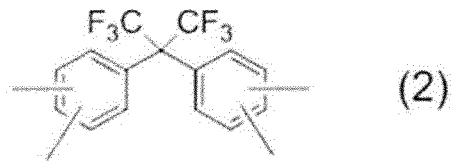 (2)

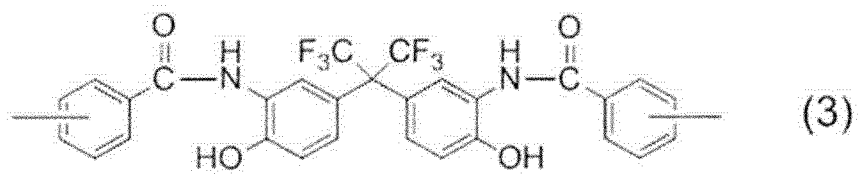 (3)

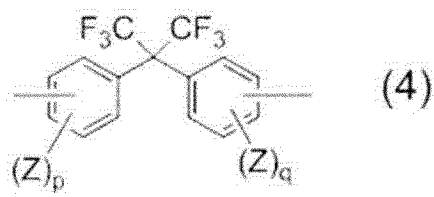 (4)

Column 63, Lines 1-5 should read:

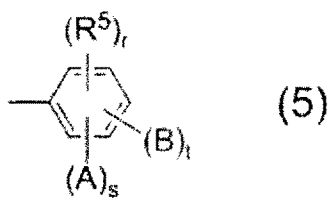 (5)

UNITED STATES PATENT AND TRADEMARK OFFICE
CERTIFICATE OF CORRECTION

PATENT NO. : 9,897,915 B2  Page 1 of 4
APPLICATION NO. : 14/647747
DATED : February 20, 2018
INVENTOR(S) : Yusuke Komori et al.

It is certified that error appears in the above-identified patent and that said Letters Patent is hereby corrected as shown below:

In the Specification

Column 16, Lines 25-65 [Chemical compound 8] should read:

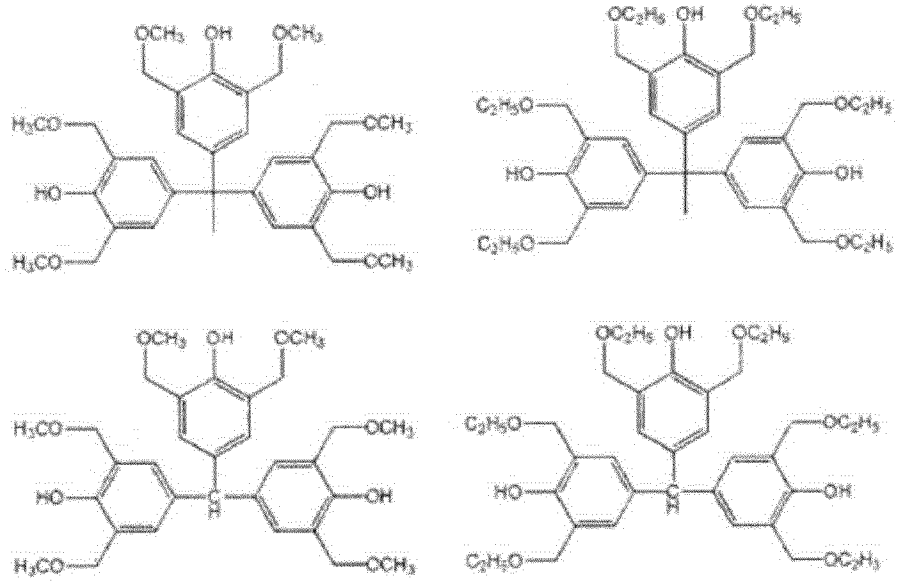

This certificate supersedes the Certificate of Correction issued July 23, 2019.

Signed and Sealed this
Eighth Day of December, 2020

Andrei Iancu
*Director of the United States Patent and Trademark Office*

CERTIFICATE OF CORRECTION (continued)
U.S. Pat. No. 9,897,915 B2

Column 29, Lines 5-10 [Chemical compound 15] should read:

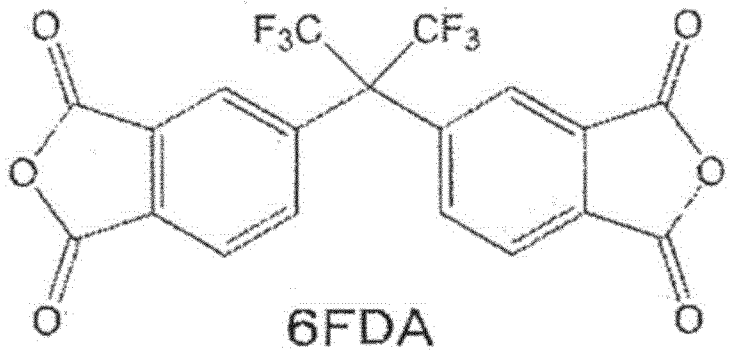

Column 31, Lines 17-24 [Chemical compound 17] should read:

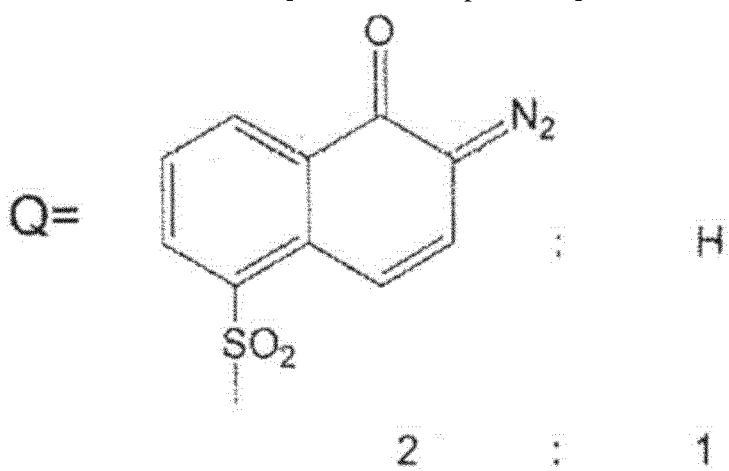

Column 32, Lines 37-60 [Chemical compound 19] should read:
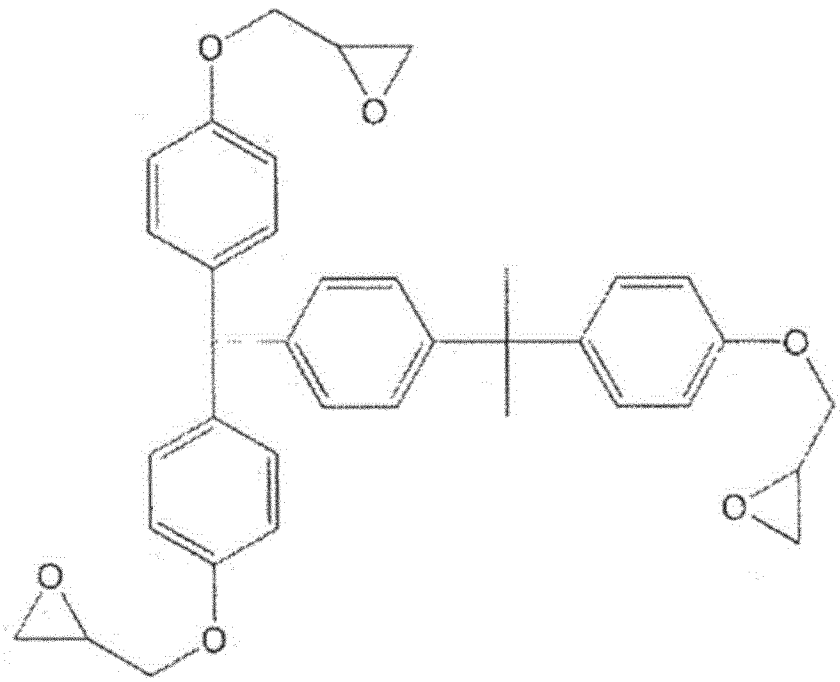
(d-3) VG-3101L
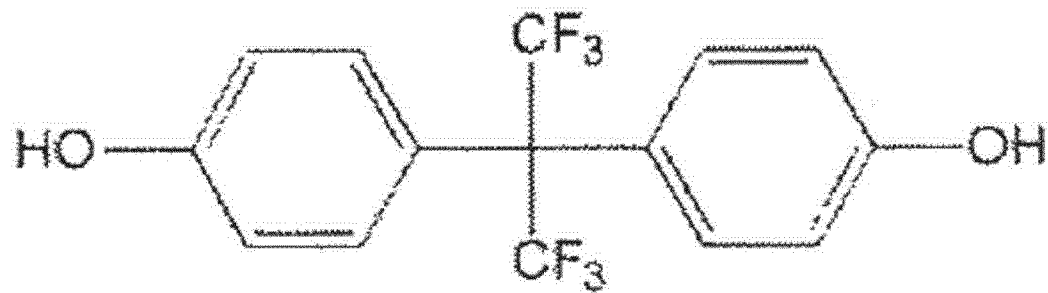
(e-1) BisP-AF

CERTIFICATE OF CORRECTION (continued)
U.S. Pat. No. 9,897,915 B2

In the Claims

Column 62, Lines 27-50 should read:

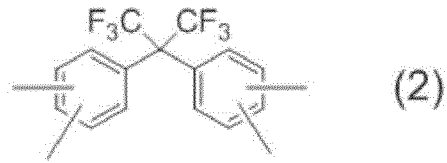
(2)

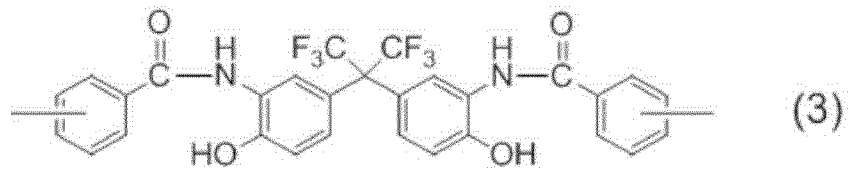
(3)

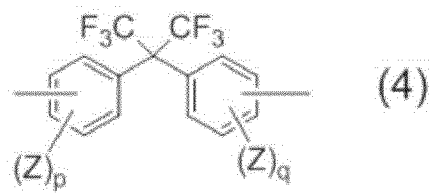
(4)

Column 63, Lines 1-5 should read:

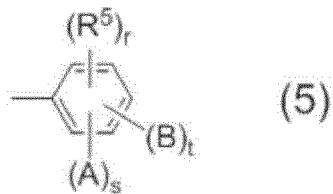
(5)